(12) United States Patent
Zhu et al.

(10) Patent No.: US 8,795,560 B2
(45) Date of Patent: Aug. 5, 2014

(54) LOW THERMAL DISTORTION SILICONE COMPOSITE MOLDS

(75) Inventors: Bizhong Zhu, Midland, MI (US); Wei Chen, Shanghai (CN)

(73) Assignee: Dow Corning Corporation, Midland, MI (US)

( * ) Notice: Subject to any disclaimer, the term of this patent is extended or adjusted under 35 U.S.C. 154(b) by 1325 days.

(21) Appl. No.: 12/294,767

(22) PCT Filed: Mar. 9, 2007

(86) PCT No.: PCT/US2007/063651
§ 371 (c)(1),
(2), (4) Date: Apr. 27, 2010

(87) PCT Pub. No.: WO2007/121006
PCT Pub. Date: Oct. 25, 2007

(65) Prior Publication Data
US 2010/0200146 A1 Aug. 12, 2010

Related U.S. Application Data

(60) Provisional application No. 60/791,182, filed on Apr. 11, 2006.

(51) Int. Cl.
*B29C 47/76* (2006.01)
*B29C 37/00* (2006.01)

(52) U.S. Cl.
CPC ............... *B29C 37/0064* (2013.01)
USPC ........................................ 264/101; 264/102

(58) Field of Classification Search
CPC .................................................. B29C 37/0064
USPC ......................................... 264/102, 227
See application file for complete search history.

(56) References Cited

U.S. PATENT DOCUMENTS

| | | | | |
|---|---|---|---|---|
| 3,989,790 | A * | 11/1976 | Bruner et al. | 264/225 |
| 4,430,461 | A | 2/1984 | Deering et al. | 523/340 |
| 4,528,324 | A * | 7/1985 | Chung et al. | 524/863 |
| 4,939,065 | A | 7/1990 | Cavezzan et al. | |
| 6,013,715 | A * | 1/2000 | Gornowicz et al. | 524/492 |
| 6,444,154 | B1 | 9/2002 | Boudreau et al. | |
| 6,617,674 | B2 | 9/2003 | Becker et al. | |
| 6,689,859 | B2 * | 2/2004 | Li et al. | 528/12 |
| 7,195,733 | B2 | 3/2007 | Rogers et al. | |
| 2005/0238967 | A1 * | 10/2005 | Rogers et al. | 430/5 |
| 2009/0202788 | A1 | 8/2009 | Fu et al. | |

FOREIGN PATENT DOCUMENTS

| | | |
|---|---|---|
| EP | 1217042 A1 | 6/2002 |
| GB | 131617 A | 10/1968 |

(Continued)

OTHER PUBLICATIONS

PCT Search Report PCT/US07/63651 dated Feb. 14, 2008.

(Continued)

*Primary Examiner* — Galen Hauth
(74) *Attorney, Agent, or Firm* — Brinks Gilson & Lione

(57) ABSTRACT

The present invention provides compositions and methods that may be used to form low thermal distortion molds. The composition may include a curable elastomeric silicone composition formed using a de-volatilized polymer and at least one de-volatilized cross-linker. One embodiment of the method may include forming a pattern on a first side of an elastomer that is impregnated with a fibrous material proximate a second side of the elastomer.

14 Claims, 6 Drawing Sheets

(56) References Cited

FOREIGN PATENT DOCUMENTS

| | | | |
|---|---|---|---|
| GB | 1205978 | A | 9/1970 |
| GB | 2242485 | A | 10/1991 |
| JP | 3259987 | | 11/1991 |
| JP | 10-44362 | | 2/1998 |
| JP | 2005-42050 | | 2/2005 |
| WO | WO2004/090636 | A | 10/2004 |

OTHER PUBLICATIONS

Michel B et al; Printing meets lithography: soft approaches to high-resolution printing; XP002466494; vol. 45, No. 5, Sep. 5, 2001.
Odom Teri W et al; Improved Pattern Transfer in Soft Lithography Using Composite Stamps; XP002466495; vol. 18, No. 13, Jun. 25, 2002.

* cited by examiner

LOW THERMAL DISTORTION SILICONE COMPOSITE MOLDS

This application is a national stage entry of PCT/US07/63651 entitled "Low Thermal Distortion Silicon Composite Molds", filed Mar. 9, 2007, which claims the benefit of U.S. Provisional Application No. 60/791,182, filed Apr. 11, 2006, and entitled "Low Thermal Distortion Silicon Composite Molds", each of which are incorporated by reference in their entirety herein.

BACKGROUND OF THE INVENTION

1. Field of the Invention

This invention relates generally to soft lithography, and, more particularly, to low thermal distortion molds that can be used in soft lithography.

2. Description of the Related Art

Soft lithography, or stamp lithography, is a technique for transferring a pattern from a master mold to a substrate. In one conventional soft lithography technique, a stamp or mold is fabricated by casting a curable silicone composition, such as a composition including polydimethylsiloxane (PDMS) and an appropriate cross-linker, against a master that includes features representative of a negative of a desired pattern. The curable silicone composition may be cured, peeled away from the master, and then used to form the desired pattern on a substrate. For example, ink may be absorbed into the stamp and then deposited on to a substrate by pressing the inked stamp on to the substrate. For another example, the stamp may be pressed into a liquid resin, which may be cured and separated from the stamp after curing. For yet another example, the stamp may be contacted with a surface and a liquid resin may be infiltrated into the areas between the stamp and the surface. The resin may be cured and the stamp may be released from the cured resin, leaving behind the desired pattern.

Advances in soft lithography have made this technique competitive with other lithographic techniques, such as photolithography. For example, soft lithographic techniques may be used to form features ranging from 0.1μ to 1μ on a silicon substrate. Compared to the lithographic techniques, soft lithographic techniques may also be used to form stamps or molds that have a relatively large area and may include relatively large features. Thus, when compared to traditional photolithography, soft lithographic techniques may offer a relatively low-cost manufacturing option. Moreover, the patterns formed using soft lithographic techniques are typically flexible and therefore soft lithographic techniques may provide the freedom to form patterns on curved surfaces.

The materials that are used to form the soft lithographic molds or stamps typically need to meet a stringent set of requirements. For example, the cured materials used to form the mold or stamp must be able to release from the master mold without damaging or altering the small and intricate features formed in the mold. The cured materials used to form the molds or stamps may also need to be able to form an intimate contact with a surface on which the pattern is to be formed or applied and may also need to adhere to the surface. Moreover, a portion of the mold or stamp may need to be able to release from the pattern formed on the surface at the completion of the pattern transfer process. If an ink is used to form or apply the pattern, the cured material used to form the mold or stamp needs to be able to absorb the ink and then should allow a portion of the ink to be deposited on the surface. One example of a curable material that may meet one or more of these requirements is Sylgard 184, which is a hydrosilylation curable liquid silicone rubber commercially available from the Dow Corning Corporation. Sylgard 184 has been widely used to form molds or stamps for use in soft lithography.

Conventional curable materials used in soft lithography may, however, have a number of disadvantages and/or limitations. For example, polydimethylsiloxane has a relatively low cross-link density, a flexible backbone chain, and relatively weak inter-chain physical interactions. Consequently, cured silicone compositions formed using polydimethylsiloxane may exhibit a relatively low modulus and/or strength, which may lead to collapse of features formed in the mold or stamp when the feature size is below a threshold value. Accordingly, the relatively low modulus and/or strength may limit the feature sizes and/or aspect ratios of features formed in the mold or stamp.

Cured silicone compositions formed using polydimethylsiloxane may also exhibit a relatively high coefficient of thermal expansion. For example, a conventional cured silicone composition formed using polydimethylsiloxane may have a coefficient of thermal expansion about 250 ppm/° C. to about 300 ppm/° C. The thermal expansion may be exaggerated by curing reactions that may cause dimensional shrinkage of the cured material. Temperature variations and the curing shrinkage may induce dimensional changes that may distort features formed in the mold and/or stamp. In some cases, the dimensional changes may make it difficult to register the features formed in the mold or stamp with features formed in or on other layers. This problem may be particularly acute in relatively large area molds or stamps.

Biebuyck (International Publication Number: WO 97/06012) describes a hybrid stamp structure for lithographic processing that may be used to form features having a typical dimension less than 1μ. The hybrid stamp structure includes a deformable layer for accommodating unevenness of the surface of a substrate and/or the stamp structure, a patterned layer in which a lithographic pattern is engraved, and a rigid support layer that may prevent deformation of the stamp under load. However, the three-layer structure of the hybrid stamp presents a number of technical difficulties, which may make this technique economically unfeasible to implement. For example, the rigid support layer is formed of a rigid material such as glass or quartz and is therefore very brittle, non-conformable, expensive, and difficult to handle.

Bruno, et al (U.S. Patent Application Publication No. 2001/0013294) points out a number of other difficulties with the techniques described by Biebuyck. For example, the likelihood that air bubbles may be included in the contact plane, which may lead to zones of failed printing due to missing contact between the stamp and the surface, as well as inhomogeneities in the thickness of the thin-film hybrid stamp due to chemical or physical shrinkage and tolerances in the printing tool that can cause uneven load on different areas of the stamp that lead to collapse of patterns and/or sagging. To address these and other difficulties with previous techniques, Bruno proposes a multi-layered stamp structure that includes a carrier layer made of a metal foil, a thin glass, or a quartz plate having a patterned layer applied to one side and a soft pattern attached to the opposite side. However, the three-layer structure of the stamp described by Bruno still presents a number of technical difficulties that may make this technique economically unfeasible to implement. For example, the carrier layer may be very brittle, non-conformable, expensive, and difficult to handle.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In various embodiments, the present invention includes compositions and methods that may be used to form low thermal distortion molds. The composition may include a curable elastomeric silicone composition formed using a de-volatilized polymer and at least one de-volatilized cross-linker. One embodiment of the method may include forming a pattern on a first side of an elastomer that is impregnated with a fibrous material proximate a second side of the elastomer.

BRIEF DESCRIPTION OF THE DRAWINGS

The invention may be understood by reference to the following description taken in conjunction with the accompanying drawings, in which like reference numerals identify like elements, and in which.

Figure 1A:
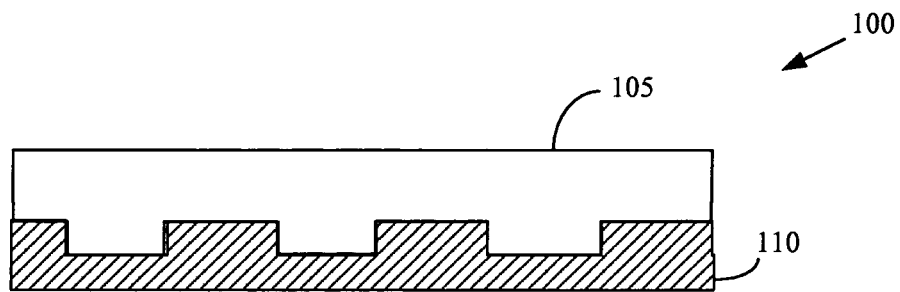
FIGS. 1A, 1B, and 1C conceptually illustrate a first exemplary embodiment of a method of forming a soft lithographic mold, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
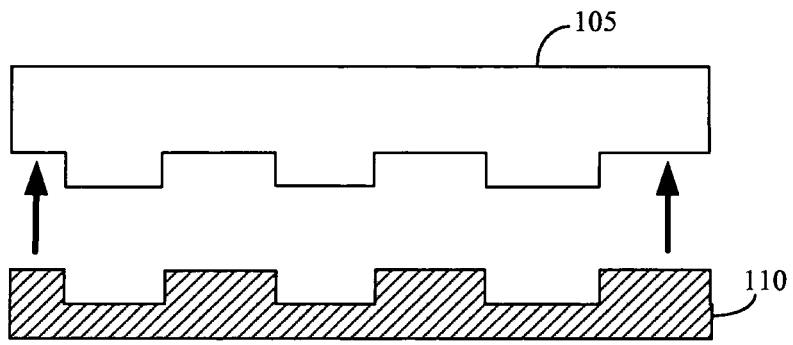
Figure 1C:
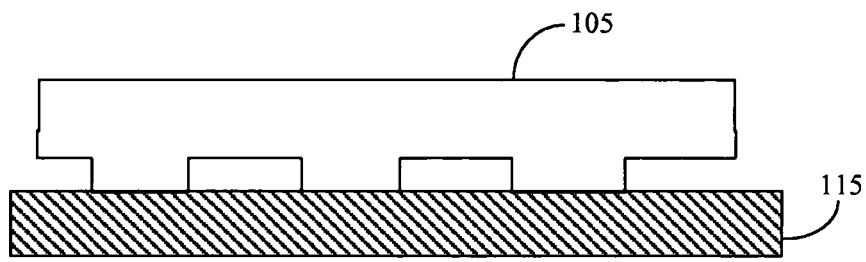

FIGS. 1A, 1B, and 1C conceptually illustrate a first exemplary embodiment of a method 100 of forming a soft lithographic mold 105. In the illustrated embodiment; a curable elastomeric silicon-containing composition is deposited over a master pattern 110. For example, the curable elastomeric silicon-containing composition may be formed by combining a de-volatilized vinyl functional siloxane polymer, a de-volatilized methyl hydrogen siloxane polymer with SiH functional groups, and an inhibitor, 2-phenyl-3-butyn-2-ol (PBO). In various alternative embodiments, the de-volatilized polymers may be de-volatilized by exposure to vacuum and/or elevated temperatures that may drive volatiles out of the polymers. Accordingly, the de-volatilized polymers, as well as the curable elastomeric silicon-containing composition, are substantially free of volatiles. Persons of ordinary skill in the art having benefit of the present disclosure should appreciate that the term "substantially free" is meant to indicate that trace amounts of volatiles may be present in the de-volatilized polymers and/or the curable elastomeric silicon-containing composition. However, these trace amounts have little or no effect on shrinkage of the mold 105, as will be discussed in detail below. The devolatilized composition may also include inorganic fillers, the size of which should be less than ~50 nm if optical clarity of the final mold is desired. The incorporation of inorganic fillers generally will reduce thermal shrinkage. The devolatilized composition can also contain rigid resins, either in the form of rigid particles, or in the form of copolymerized segments in the network structure. An example of these resins is silicone resins. The devolatilized composition can also be cured by other mechanisms such as peroxide initiated free radical cure, UV, e-beam or other radiation cure, microwave cure, etc.

The curable elastomeric silicon-containing composition is then cured to form the mold 105, as shown in FIG. 1A. In various alternative embodiments, the curing process may include adding one or more catalysts as well as exposing the curable elastomeric silicon-containing composition to elevated temperatures. For example, the curable elastomeric silicon-containing composition may be cured using a Pt catalyst and an inhibitor, and allowing the curable elastomeric silicon-containing composition to remain in contact with the master pattern at room temperature. The concentration of the catalyst is usually 0.1 to 1000 ppm. The molar ratio between the inhibitor and the catalyst is usually between 0.5 to 500. For example, the inhibitor may have a concentration of about 0 to 10 wt. %.

Linear shrinkage of the mold 105 during cure may be reduced at least in part because the curable elastomeric silicon-containing composition is substantially free of volatiles.

In one embodiment, the catalyst level and the inhibitor concentration as well as their combinations may be optimized to further reduce dimensional shrinkage of the mold 110 during cure. For example, the concentration of the catalyst can be increased from about 0.5 ppm to about 100 ppm, or the inhibitor to catalyst ratio can be decreased from 100 to 3. The linear shrinkage of the mold 105 formed using the curable elastomeric silicon-containing composition described above has been measured to be approximately 0.01% following the room temperature cure. In contrast, a conventional curable silicon-containing composition such as Sylgard 184 exhibits a linear shrinkage of about 1% after a room temperature cure.

The cured mold 105 may be removed from the master pattern 110, as shown in FIG. 1B, and then used to form or apply a replica of the pattern on a substrate 115, as shown in FIG. 1C. For example, ink may be absorbed into the mold 105 and then deposited on to the substrate 115 by pressing the inked stamp on to the substrate 115. For another example, the mold 105 may be pressed into a liquid resin (not shown), which may be cured and separated from the mold 105 after curing. For yet another example, the mold 105 may be contacted with the substrate 115 and a liquid resin may be infiltrated into the areas between the mold 105 and the substrate 115. The resin may be cured and the mold 105 may be released from the cured resin, leaving behind the desired pattern. However, the particular method of forming, transferring, or applying the pattern to the substrate 115 is a matter of design choice and not material to the present invention.

FIGS. 2A, 2B, 2C, 2D, 2E, 2F, and 2G conceptually illustrate a second exemplary embodiment of a method 200 of forming a soft lithographic mold. In the illustrated embodiment, a substrate 205 is treated to form a release layer 210 that is intended to decreased adherence of subsequently formed layers to the substrate 205 and to allow the subsequently formed layers to be released from the substrate 205. The release layer 210 can be any rigid or flexible material having a surface from which the reinforced silicone resin film can be removed without damage by delamination after the silicone resin is cured, as described below. Examples of release liners include, but are not limited to, Nylon, polyethyleneterephthalate, polyimide, PTFE, silicone, and sol gel coatings. For example, the substrate 205 may be a glass plate having dimensions of 6"×6" that is treated with Relisse® 2520, from Nanofilm, Inc of Valley View, Ohio to form the release layer 210. However, persons of ordinary skill in the art having benefit of the present disclosure should appreciate that any material may be used to form the substrate 205 and/or the release layer 210. Furthermore, the release layer 205 is optional and not necessary for the practice of the present invention.

Figure 2A:
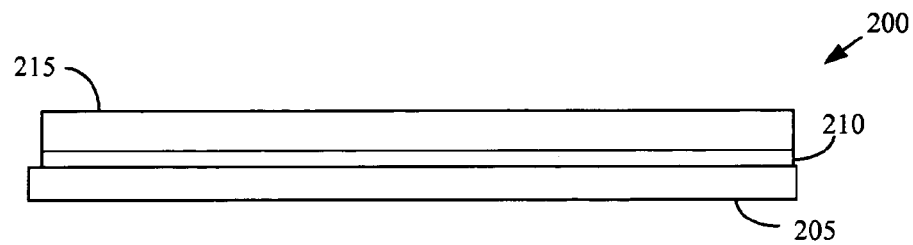
FIGS. 2A, 2B, 2C, 2D, 2E, 2F, and 2G conceptually illustrate a second exemplary embodiment of a method of forming a soft lithographic mold, in accordance with the present invention.

A film of curable silicon-containing composition 215 is then deposited over the substrate 205 and (if present) the release layer 210, as shown in FIG. 2A. The film of curable silicon-containing composition 215 may be deposited using conventional coating techniques, such as spin coating, dipping, spraying, brushing, or screen-printing. In one embodiment, the film of curable silicon-containing composition 215 includes a resin, one or more cross-linkers, and a catalyst that are diluted with toluene. For example, the film of curable silicon-containing composition 215 may be a solventless curable silicone resin formed using 10 g of a silicone resin, 9.3 g of one or more cross-linkers, and a 0.1 g of a Pt catalyst diluted with toluene to 1000 ppm Pt from a $Pt/(ViMe_2Si)_2O$ complex available from Dow Corning Corporation, Midland, Mich.

The silicone resin used in the film of curable silicon-containing composition 215 may be a silicone resin having an average composition of $(MeSiO_{3/2})_{0.4}(ViMe_2SiO_{1/2})_{0.6}$, which may be formed by adding 100 g of $MeSi(OMe)_3$ and 100.4 g of $(ViMe_2Si)_2O$ to a three-necked 500 ml flask equipped with a thermometer, a condenser, a Dean Stark trap, and a stirrer. Approximately 0.2 g of trifluoromethane sulfonic acid may then be added and the mixture stirred without heating for 30 minutes. Following the step, approximately 40 g of de-ionized water may be added and the mixture heated to 60° C. for 40 minutes. After cooling the mixture to below 40° C., approximately 0.2 g of $CaCO_3$ may be added and the mixture stirred for 2 hours. Then approximately 16 g of toluene may be added and the mixture heated to reflux. Methanol may be removed until the temperature reaches 85° C. After cooling the mixture to below 40° C., approximately 0.1 g of KOH aqueous solution may be added. The mixture may be heated to reflux and water continuously removed from the bottom of the condenser until substantially no water is coming out. The mixture may then be cooled to below 40° C. and approximately 0.11 g of vinyldimethylchlorosilane may be added. After stirring for half an hour the product may be filtered to remove precipitants. Residual toluene may be removed on a rotary evaporator at 80° C. and 5 mmHg.

The cross-linkers may include compositions including $Me_3SiO(HMeSiO)_2SiMe_3$. A crude supply of the cross-linker may be obtained from Dow Corning Corporation. However, the commercially available supply of the cross-linker typically contains a mixture of related components $Me_3SiO(HMeSiO)_nSiMe_3$, with n ranging from 1 to 10. Thus, in one embodiment, a lab distillation unit with vacuum and a fractionation column may be used to separate the components. For example, the main useful component, $Me_3SiO(HMeSiO)_2SiMe_3$ may be the major product of the distillation process. In some embodiments, the other components $Me_3SiO(HMeSiO)_nSiMe_3$ that have a higher degree of polymerization can also be used as cross-linkers.

The curable silicon-containing composition described above is only one example of a composition that may be used to form the layer 215. In alternative embodiments, the curable silicon-containing composition may be a hydrosilylation-curable silicone composition that can be any hydrosilylation-curable silicone composition comprising a silicone resin. Such compositions typically contain a silicone resin having silicon-bonded alkenyl groups or silicon-bonded hydrogen atoms, a cross-linking agent having silicon-bonded hydrogen atoms or silicon-bonded alkenyl groups capable of reacting with the silicon-bonded alkenyl groups or silicon-bonded hydrogen atoms in the resin, and a hydrosilylation catalyst. The silicone resin is typically a copolymer containing T and/or Q siloxane units in combination with M and/or D siloxane units. Moreover, the silicone resin can be a rubber-modified silicone resin, described below for the fifth and sixth embodiments of the silicone composition.

According to a first embodiment, the hydrosilylation-curable silicone composition comprises (A) a silicone resin having the formula $(R^1R^2_2SiO_{1/2})_w(R^2_2SiO_{2/2})_x(R_1SiO_{3/2})_y(SiO_{4/2})_z$ (I), wherein $R^1$ is C1 to C10 hydrocarbyl or C1 to C10 halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded alkenyl groups per molecule; (B) an organosilicon compound having an average of at least two silicon-bonded hydrogen atoms per molecule in an amount sufficient to cure the silicone resin; and (C) a catalytic amount of a hydrosilylation catalyst.

Component (A) is at least one silicone resin having the formula $(R^1R^2_2SiO_{1/2})_w(R^2_2SiO_{2/2})_x(R^1SiO_{3/2})_y(SiO_{4/2})_z$ (I), wherein $R^1$ is C1 to C10 hydrocarbyl or C1 to C10 halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, $w+x+y+z=1$, $y+z/(w+x+y+z)$ is from 0.2 to 0.99, and $w+x/(w+x+y+z)$ is from 0.01 to 0.8, provided the silicone resin has an average of at least two silicon-bonded alkenyl groups per molecule.

The hydrocarbyl and halogen-substituted hydrocarbyl groups represented by $R^1$ are free of aliphatic unsaturation and typically have from 1 to 10 carbon atoms, alternatively from 1 to 6 carbon atoms. Acyclic hydrocarbyl and halogen-substituted hydrocarbyl groups containing at least 3 carbon atoms can have a branched or unbranched structure. Examples of hydrocarbyl groups represented by $R^1$ include, but are not limited to, alkyl, such as methyl, ethyl, propyl, 1-methylethyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, 2,2-dimethylpropyl, hexyl, heptyl, octyl, nonyl, and decyl; cycloalkyl, such as cyclopentyl, cyclohexyl, and methylcyclohexyl; aryl, such as phenyl and naphthyl; alkaryl, such as tolyl and xylyl; and aralkyl, such as benzyl and phenethyl. Examples of halogen-substituted hydrocarbyl groups represented by R1 include, but are not limited to, 3,3,3-trifluoropropyl, 3-chloropropyl, chlorophenyl, dichlorophenyl, 2,2,2-trifluoroethyl, 2,2,3,3-tetrafluoropropyl, and 2,2,3,3,4,4,5,5-octafluoropentyl.

The alkenyl groups represented by $R^2$, which may be the same or different, typically have from 2 to about 10 carbon atoms, alternatively from 2 to 6 carbon atoms, and are exemplified by, but not limited to, vinyl, allyl, butenyl, hexenyl, and octenyl.

In the formula (I) of the silicone resin, the subscripts w, x, y, and z are mole fractions. The subscript w typically has a value of from 0 to 0.8, alternatively from 0.02 to 0.75, alternatively from 0.05 to 0.3; the subscript x typically has a value of from 0 to 0.6, alternatively from 0 to 0.45, alternatively from 0 to 0.25; the subscript y typically has a value of from 0 to 0.99, alternatively from 0.25 to 0.8, alternatively from 0.5 to 0.8; the subscript z typically has a value of from 0 to 0.35, alternatively from 0 to 0.25, alternatively from 0 to 0.15. Also, the ratio $y+z/(w+x+y+z)$ is typically from 0.2 to 0.99, alternatively from 0.5 to 0.95, alternatively from 0.65 to 0.9. Further, the ratio $w+x/(w+x+y+z)$ is typically from 0.01 to 0.80, alternatively from 0.05 to 0.5, alternatively from 0.1 to 0.35.

Typically at least 50 mol %, alternatively at least 65 mol %, alternatively at least 80 mol % of the groups $R^2$ in the silicone resin are alkenyl.

The silicone resin typically has a number-average molecular weight (Mn) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The viscosity of the silicone resin at 25° C. is typically from 0.01 to 100,000 Pa·s, alternatively from 0.1 to 10,000 Pa·s, alternatively from 1 to 100 Pa·s.

The silicone resin typically contains less than 10% (w/w), alternatively less than 5% (w/w), alternatively less than 2% (w/w), of silicon-bonded hydroxy groups, as determined by $^{29}Si$ NMR.

The silicone resin contains $R^1SiO_{3/2}$ units (i.e., T units) and/or $SiO_{4/2}$ units (i.e., Q units) in combination with $R^1R^2_2SiO_{1/2}$ units (i.e., M units) and/or $R^2_2SiO_{2/2}$ units (i.e., D units), where $R^1$ and $R^2$ are as described and exemplified above. For example, the silicone resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of silicone resins include, but are not limited to, resins having the following formulae:

$(Vi_2MeSiO_{1/2})_{0.25}(PhSiO_{3/2})_{0.75}$, $(ViMe_2SiO_{1/2})_{0.25}(PhSiO_{3/2})_{0.75}$, $(ViMe_2SiO_{1/2})_{0.25}(MeSiO_{3/2})_{0.25}(PhSiO_{3/2})_{0.50}$, $(ViMe_2SiO_{1/2})_{0.15}(PhSiO_{3/2})_{0.75}(SiO_{4/2})_{0.1}$, and $(Vi_2MeSiO_{1/2})_{0.15}(ViMe_2SiO_{1/2})_{0.1}(PhSiO_{3/2})_{0.75}$, where Me is methyl, Vi is vinyl, Ph is phenyl, and the numerical subscripts outside the parenthesis denote mole fractions. Also, in the preceding formulae, the sequence of units is unspecified.

Component (A) can be a single silicone resin or a mixture comprising two or more different silicone resins, each as described above.

Methods of preparing silicone resins are well known in the art; many of these resins are commercially available. Silicone resins are typically prepared by cohydrolyzing the appropriate mixture of chlorosilane precursors in an organic solvent, such as toluene. For example, a silicone resin consisting essentially of $R^1R^2_2SiO_{1/2}$ units and $R^1SiO_{3/2}$ units can be prepared by cohydrolyzing a compound having the formula $R^1R^2_2SiCl$ and a compound having the formula $R^1SiCl_3$ in toluene, where $R^1$ and $R^2$ are as defined and exemplified above. The aqueous hydrochloric acid and silicone hydrolyzate are separated and the hydrolyzate is washed with water to remove residual acid and heated in the presence of a mild condensation catalyst to "body" the resin to the requisite viscosity. If desired, the resin can be further treated with a condensation catalyst in an organic solvent to reduce the content of silicon-bonded hydroxy groups. Alternatively, silanes containing hydrolysable groups other than chloro, such —Br, —I, —OCH₃, —OC(O)CH₃, —N(CH₃)₂, NHCOCH₃, and —SCH₃, can be utilized as starting materials in the cohydrolysis reaction. The properties of the resin products depend on the types of silanes, the mole ratio of silanes, the degree of condensation, and the processing conditions.

Component (B) is at least one organosilicon compound having an average of at least two silicon-bonded hydrogen atoms per molecule in an amount sufficient to cure the silicone resin of component (A).

The organosilicon compound has an average of at least two silicon-bonded hydrogen atoms per molecule, alternatively at least three silicon-bonded hydrogen atoms per molecule. It is generally understood that cross-linking occurs when the sum of the average number of alkenyl groups per molecule in component (A) and the average number of silicon-bonded hydrogen atoms per molecule in component (B) is greater than four.

The organosilicon compound can be an organohydrogensilane or an organohydrogensiloxane. The organohydrogensilane can be a monosilane, disilane, trisilane, or polysilane. Similarly, the organohydrogensiloxane can be a disiloxane, trisiloxane, or polysiloxane. The structure of the organosilicon compound can be linear, branched, cyclic, or resinous. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded hydrogen atoms can be located at terminal, pendant, or at both terminal and pendant positions.

Examples of organohydrogensilanes include, but are not limited to, diphenylsilane, 2-chloroethylsilane, bis[(p-dimethylsilyl)phenyl]ether, 1,4-dimethyldisilylethane, 1,3,5-tris (dimethylsilyl)benzene, 1,3,5-trimethyl-1,3,5-trisilane, poly(methylsilylene)phenylene, and poly(methylsilylene)methylene.

The organohydrogensilane can also have the formula HR$^1_2$Si—R$^3$—SiR$^1_2$H, wherein R$^1$ is C1 to C10 hydrocarbyl or C1 to C10 halogen-substituted hydrocarbyl, both free of aliphatic unsaturation, and R$^3$ is a hydrocarbylene group free of aliphatic unsaturation having a formula selected from:

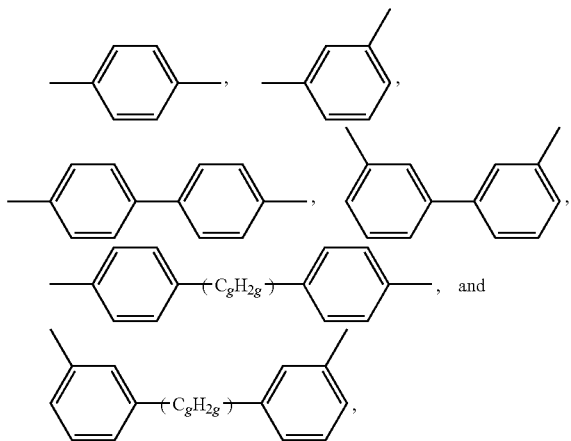

wherein g is from 1 to 6. The hydrocarbyl and halogen-substituted hydrocarbyl groups represented by R$^1$ are as defined and exemplified above for the silicone resin of component (A).

Examples of organohydrogensilanes having the formula HR$^1_2$Si—R$^3$—SiR$^1_2$H, wherein R$^1$ and R$^3$ are as described and exemplified above include, but are not limited to, silanes having the following formulae:

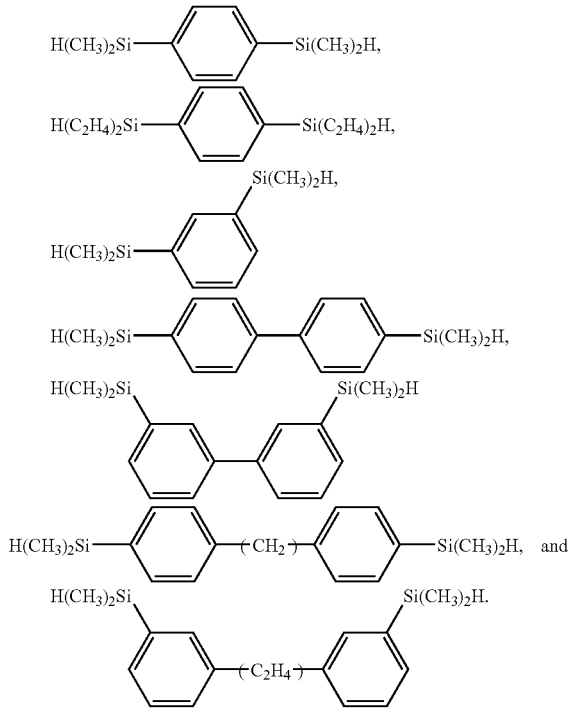

Examples of organohydrogensiloxanes include, but are not limited to, 1,1,3,3-tetramethyldisiloxane, 1,1,3,3-tetraphenyldisiloxane, phenyltris(dimethylsiloxy)silane, 1,3,5-trimethylcyclotrisiloxane, a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of HMe$_2$SiO$_{1/2}$ units, Me$_3$SiO$_{1/2}$ units, and SiO$_{4/2}$ units, wherein Me is methyl.

The organohydrogensiloxane can also be an organohydrogenpolysiloxane resin having the formula (R$^1$R$^4_2$SiO$_{1/2}$)$_w$(R$^4_2$SiO$_{2/2}$)$_x$(R$^1$SiO$_{3/2}$)$_y$(SiO$_{4/2}$)$_z$ (II), wherein R$_1$ is C1 to C10 hydrocarbyl or C1 to C10 halogen-substituted hydrocarbyl, both free of aliphatic unsaturation, R$^4$ is R$^1$ or an organosilylalkyl group having at least one silicon-bonded hydrogen atom, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided at least 50 mol % of the groups R4 are organosilylalkyl.

The hydrocarbyl and halogen-substituted hydrocarbyl groups represented by R1 are as described and exemplified above for the silicone resin of component (A). Examples of organosilylalkyl groups represented by R4 include, but are not limited to, groups having the following formulae:

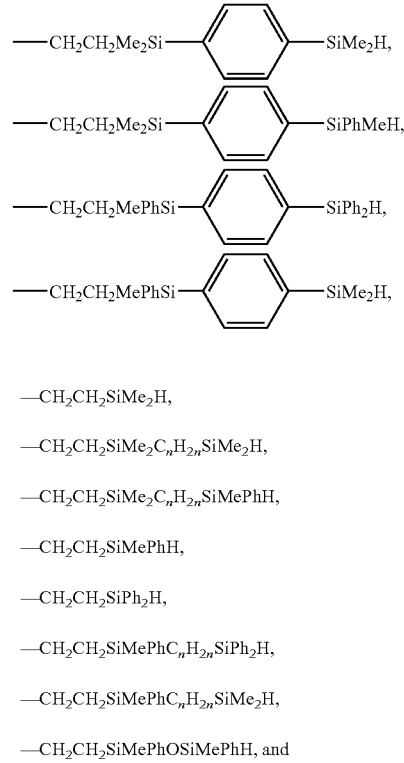

—CH$_2$CH$_2$SiMe$_2$H,

—CH$_2$CH$_2$SiMe$_2$C$_n$H$_{2n}$SiMe$_2$H,

—CH$_2$CH$_2$SiMe$_2$C$_n$H$_{2n}$SiMePhH,

—CH$_2$CH$_2$SiMePhH,

—CH$_2$CH$_2$SiPh$_2$H,

—CH$_2$CH$_2$SiMePhC$_n$H$_{2n}$SiPh$_2$H,

—CH$_2$CH$_2$SiMePhC$_n$H$_{2n}$SiMe$_2$H,

—CH$_2$CH$_2$SiMePhOSiMePhH, and

—CH$_2$CH$_2$SiMePhOSiPh(OSiMePhH)$_2$, where Me is methyl, Ph is phenyl, and the subscript n has a value of from 2 to 10.

In the formula (II) of the organohydrogenpolysiloxane resin, the subscripts w, x, y, and z are mole fractions. The subscript w typically has a value of from 0 to 0.8, alternatively from 0.02 to 0.75, alternatively from 0.05 to 0.3; the subscript x typically has a value of from 0 to 0.6, alternatively from 0 to 0.45, alternatively from 0 to 0.25; the subscript y typically has a value of from 0 to 0.99, alternatively from 0.25 to 0.8, alternatively from 0.5 to 0.8; the subscript z typically has a value of from 0 to 0.35, alternatively from 0 to 0.25, alternatively from 0 to 0.15. Also, the ratio y+z/(w+x+y+z) is typically from 0.2 to 0.99, alternatively from 0.5 to 0.95, alternatively from 0.65 to 0.9. Further, the ratio w+x/(w+x+y+z) is typically from 0.01 to 0.80, alternatively from 0.05 to 0.5, alternatively from 0.1 to 0.35.

Typically, at least 50 mol %, alternatively at least 65 mol %, alternatively at least 80 mol % of the groups $R^4$ in the organohydrogenpolysiloxane resin are organosilylalkyl groups having at least one silicon-bonded hydrogen atom.

The organohydrogenpolysiloxane resin typically has a number-average molecular weight (Mn) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The organohydrogenpolysiloxane resin typically contains less than 10% (w/w), alternatively less than 5% (w/w), alternatively less than 2% (w/w), of silicon-bonded hydroxy groups, as determined by $^{29}$Si NMR.

The organohydrogenpolysiloxane resin contains $R^1SiO_{3/2}$ units (i.e., T units) and/or $SiO_{4/2}$ units (i.e., Q units) in combination with $R^1R^4{}_2SiO_{1/2}$ units (i.e., M units) and/or $R^4{}_2SiO_{2/2}$ units (i.e., D units), where $R^1$ and $R^4$ are as described and exemplified above. For example, the organohydrogenpolysiloxane resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of organohydrogenpolysiloxane resins include, but are not limited to, resins having the following formulae:
$((HMe_2SiC_6H_4SiMe_2CH_2CH_2)_2MeSiO_{1/2})_{0.12}$
$(PhSiO_{3/2})_{0.88}$, $((HMe_2SiC_6H_4SiMe_2CH_2CH_2)_2MeSiO_{1/2})_{0.17}(PhSiO_{3/2})_{0.83}$, $((HMe_2SiC_6H_4SiMe_2CH_2CH_2)_2MeSiO_{1/2})_{0.17}(MeSiO_{3/2})_{0.17}(PhSiO_{3/2})_{0.66}$,
$((HMe_2SiC_6H_4SiMe_2CH_2CH_2)_2MeSiO_{1/2})_{0.15}(PhSiO_{3/2})_{0.75}(SiO_{4/2})_{0.10}$, and $((HMe_2SiC_6H_4SiMe_2CH_2CH_2)_2MeSiO_{1/2})_{0.08}((HMe_2SiC_6H_4SiMe_2CH_2CH_2)Me_2SiO_{1/2})_{0.06}(PhSiO_{3/2})_{0.86}$, where Me is methyl, Ph is phenyl, $C_6H_4$ denotes a para-phenylene group, and the numerical subscripts outside the parenthesis denote mole fractions. Also, in the preceding formulae, the sequence of units is unspecified.

Component (B) can be a single organosilicon compound or a mixture comprising two or more different organosilicon compounds, each as described above. For example, component (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane. In particular, component (B) can be a mixture comprising at least 0.5% (w/w), alternatively at least 50% (w/w), alternatively at least 75% (w/w), based on the total weight of component (B), of the organohydrogenpolysiloxane resin having the formula (II), and an organohydrogensilane and/or organohydrogensiloxane, the latter different from the organohydrogenpolysiloxane resin.

The concentration of component (B) is sufficient to cure (cross-link) the silicone resin of component (A). The exact amount of component (B) depends on the desired extent of cure, which generally increases as the ratio of the number of moles of silicon-bonded hydrogen atoms in component (B) to the number of moles of alkenyl groups in component (A) increases. The concentration of component (B) is typically sufficient to provide from 0.4 to 2 moles of silicon-bonded hydrogen atoms, alternatively from 0.8 to 1.5 moles of silicon-bonded hydrogen atoms, alternatively from 0.9 to 1.1 moles of silicon-bonded hydrogen atoms, per mole of alkenyl groups in component (A).

Methods of preparing organosilicon compounds containing silicon-bonded hydrogen atoms are well known in the art. For example, organohydrogensilanes can be prepared by reaction of Grignard reagents with alkyl or aryl halides. In particular, organohydrogensilanes having the formula $HR^1{}_2Si—R^3—SiR^1{}_2H$ can be prepared by treating an aryl dihalide having the formula $R^3X_2$ with magnesium in ether to produce the corresponding Grignard reagent and then treating the Grignard reagent with a chlorosilane having the formula $HR^1{}_2SiCl$, where $R^1$ and $R^3$ are as described and exemplified above.

Methods of preparing organohydrogensiloxanes, such as the hydrolysis and condensation of organohalosilanes, are also well known in the art.

In addition, the organohydrogenpolysiloxane resin having the formula (II) can be prepared by reacting (a) a silicone resin having the formula $(R^1R^2{}_2SiO_{1/2})_w(R^2{}_2SiO_{2/2})_x(R^1SiO_{3/2})_y(SiO_{4/2})_z$ (I) with (b) an organosilicon compound having an average of from two to four silicon-bonded hydrogen atoms per molecule and a molecular weight less than 1,000, in the presence of (c) a hydrosilylation catalyst and, optionally, (d) an organic solvent, wherein $R^1$ is C1 to C10 hydrocarbyl or C1 to C10 halogen-substituted hydrocarbyl, both free of aliphatic unsaturation, $R^2$ is $R^1$ or alkenyl, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (a) has an average of at least two silicon-bonded alkenyl groups per molecule, and the mole ratio of silicon-bonded hydrogen atoms in (b) to alkenyl groups in (a) is from 1.5 to 5.

Silicone resin (a) is as described and exemplified above for component (A) of the silicone composition. Silicone resin (a) can be the same as or different than the silicone resin used as component (A) in the hydrosilylation-curable silicone composition.

Organosilicon compound (b) is at least one organosilicon compound having an average of from two to four silicon-bonded hydrogen atoms per molecule. Alternatively, the organosilicon compound has an average of from two to three silicon-bonded hydrogen atoms per molecule. The organosilicon compound typically has a molecular weight less than 1,000, alternatively less than 750, alternatively less than 500. The silicon-bonded organic groups in the organosilicon compound are selected from hydrocarbyl and halogen-substituted hydrocarbyl groups, both free of aliphatic unsaturation, which are as described and exemplified above for $R^1$ in the formula of the silicone resin of component (A).

Organosilicon compound (b) can be an organohydrogensilane or an organohydrogensiloxane. The organohydrogensilane can be a monosilane, disilane, trisilane, or polysilane. Similarly, the organohydrogensiloxane can be a disiloxane, trisiloxane, or polysiloxane. The structure of the organosilicon compound can be linear, branched, or cyclic. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded hydrogen atoms can be located at terminal, pendant, or at both terminal and pendant positions.

Examples of organohydrogensilanes include, but are not limited to, diphenylsilane, 2-chloroethylsilane, bis[(p-dimethylsilyl)phenyl]ether, 1,4-dimethyldisilylethane, 1,3,5-tris(dimethylsilyl)benzene, and 1,3,5-trimethyl-1,3,5-trisilane.

The organohydrogensilane can also have the formula $HR^1_2Si-R^3-SiR^1_2H$, wherein $R^1$ and $R^3$ are as described and exemplified above.

Examples of organohydrogensiloxanes include, but are not limited to, 1,1,3,3-tetramethyldisiloxane, 1,1,3,3-tetraphenyldisiloxane, phenyltris(dimethylsiloxy)silane, and 1,3,5-trimethylcyclotrisiloxane.

Organosilicon compound (b) can be a single organosilicon compound or a mixture comprising two or more different organosilicon compounds, each as described above. For example, component (B) can be a single organohydrogensilane, a mixture of two different organohydrogensilanes, a single organohydrogensiloxane, a mixture of two different organohydrogensiloxanes, or a mixture of an organohydrogensilane and an organohydrogensiloxane.

Methods of preparing organohydrogensilanes, such as the reaction of Grignard reagents with alkyl or aryl halides, described above, are well known in the art. Similarly, methods of preparing organohydrogensiloxanes, such as the hydrolysis and condensation of organohalosilanes, are well known in the art.

Hydrosilylation catalyst (c) can be any of the well-known hydrosilylation catalysts comprising a platinum group metal (i.e., platinum, rhodium, ruthenium, palladium, osmium and iridium) or a compound containing a platinum group metal. Preferably, the platinum group metal is platinum, based on its high activity in hydrosilylation reactions.

Hydrosilylation catalysts include the complexes of chloroplatinic acid and certain vinyl-containing organosiloxanes disclosed by Willing in U.S. Pat. No. 3,419,593, which is hereby incorporated by reference. A catalyst of this type is the reaction product of chloroplatinic acid and 1,3-diethenyl-1,1,3,3-tetramethyldisiloxane.

The hydrosilylation catalyst can also be a supported hydrosilylation catalyst comprising a solid support having a platinum group metal on the surface thereof. A supported catalyst can be conveniently separated from the organohydrogenpolysiloxane resin product, for example, by filtering the reaction mixture. Examples of supported catalysts include, but are not limited to, platinum on carbon, palladium on carbon, ruthenium on carbon, rhodium on carbon, platinum on silica, palladium on silica, platinum on alumina, palladium on alumina, and ruthenium on alumina.

Organic solvent (d) is at least one organic solvent. The organic solvent can be any aprotic or dipolar aprotic organic solvent that does not react with silicone resin (a), organosilicon compound (b), or the organohydrogenpolysiloxane resin under the conditions of the present method, and is miscible with components (a), (b), and the organohydrogenpolysiloxane resin.

Examples of organic solvents include, but are not limited to, saturated aliphatic hydrocarbons such as n-pentane, hexane, n-heptane, isooctane and dodecane; cycloaliphatic hydrocarbons such as cyclopentane and cyclohexane; aromatic hydrocarbons such as benzene, toluene, xylene and mesitylene; cyclic ethers such as tetrahydrofuran (THF) and dioxane; ketones such as methyl isobutyl ketone (MIBK); halogenated alkanes such as trichloroethane; and halogenated aromatic hydrocarbons such as bromobenzene and chlorobenzene. Organic solvent (d) can be a single organic solvent or a mixture comprising two or more different organic solvents, each as described above.

The reaction can be carried out in any standard reactor suitable for hydrosilylation reactions. Suitable reactors include glass and Teflon-lined glass reactors. Preferably, the reactor is equipped with a means of agitation, such as stirring.

Also, preferably, the reaction is carried out in an inert atmosphere, such as nitrogen or argon, in the absence of moisture.

The silicone resin, organosilicon compound, hydrosilylation catalyst, and, optionally, organic solvent, can be combined in any order. Typically, organosilicon compound (b) and hydrosilylation catalyst (c) are combined before the introduction of the silicone resin (a) and, optionally, organic solvent (d).

The reaction is typically carried out at a temperature of from 0 to 150° C., alternatively from room temperature (~23±2° C.) to 115° C. When the temperature is less than 0° C., the rate of reaction is typically very slow.

The reaction time depends on several factors, such as the structures of the silicone resin and the organosilicon compound, and the temperature. The time of reaction is typically from 1 to 24 h at a temperature of from room temperature (~23±2° C.) to 150° C. The optimum reaction time can be determined by routine experimentation The mole ratio of silicon-bonded hydrogen atoms in organosilicon compound (b) to alkenyl groups in silicone resin (a) is typically from 1.5 to 5, alternatively from 1.75 to 3, alternatively from 2 to 2.5.

The concentration of hydrosilylation catalyst (c) is sufficient to catalyze the addition reaction of silicone resin (a) with organosilicon compound (b). Typically, the concentration of hydrosilylation catalyst (c) is sufficient to provide from 0.1 to 1000 ppm of a platinum group metal, alternatively from 1 to 500 ppm of a platinum group metal, alternatively from 5 to 150 ppm of a platinum group metal, based on the combined weight of silicone resin (a) and organosilicon compound (b). The rate of reaction is very slow below 0.1 ppm of platinum group metal. The use of more than 1000 ppm of platinum group metal results in no appreciable increase in reaction rate, and is therefore uneconomical.

The concentration of organic solvent (d) is typically from 0 to 99% (w/w), alternatively from 30 to 80% (w/w), alternatively from 45 to 60% (w/w), based on the total weight of the reaction mixture.

The organohydrogenpolysiloxane resin can be used without isolation or purification in the first embodiment of the hydrosilylation-curable silicone composition or the resin can be separated from most of the solvent by conventional methods of evaporation. For example, the reaction mixture can be heated under reduced pressure. Moreover, when the hydrosilylation catalyst used to prepare the organohydrogenpolysiloxane resin is a supported catalyst, described above, the resin can be readily separated from the hydrosilylation catalyst by filtering the reaction mixture. However, when the organohydrogenpolysiloxane resin is not separated from the hydrosilylation catalyst used to prepare the resin, the catalyst may be used as component (C) of the first embodiment of the hydrosilylation-curable silicone composition.

Component (C) of the hydrosilylation-curable silicone composition is at least one hydrosilylation catalyst that promotes the addition reaction of component (A) with component (B). The hydrosilylation catalyst can be any of the well-known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

Preferred hydrosilylation catalysts include the complexes of chloroplatinic acid and certain vinyl-containing organosiloxanes disclosed by Willing in U.S. Pat. No. 3,419,593, which is hereby incorporated by reference. A preferred catalyst of this type is the reaction product of chloroplatinic acid and 1,3-diethenyl-1,1,3,3-tetramethyldisiloxane.

The hydrosilylation catalyst can also be a microencapsulated platinum group metal-containing catalyst comprising a platinum group metal encapsulated in a thermoplastic resin. Compositions containing microencapsulated hydrosilylation catalysts are stable for extended periods of time, typically several months or longer, under ambient conditions, yet cure relatively rapidly at temperatures above the melting or softening point of the thermoplastic resin(s). Microencapsulated hydrosilylation catalysts and methods of preparing them are well known in the art, as exemplified in U.S. Pat. No. 4,766, 176 and the references cited therein; and U.S. Pat. No. 5,017, 654.

Component (C) can be a single hydrosilylation catalyst or a mixture comprising two or more different catalysts that differ in at least one property, such as structure, form, platinum group metal, complexing ligand, and thermoplastic resin.

The concentration of component (C) is sufficient to catalyze the addition reaction of component (A) with component (B). Typically, the concentration of component (C) is sufficient to provide from 0.1 to 1000 ppm of a platinum group metal, preferably from 1 to 500 ppm of a platinum group metal, and more preferably from 5 to 150 ppm of a platinum group metal, based on the combined weight of components (A) and (B). The rate of cure is very slow below 0.1 ppm of platinum group metal. The use of more than 1000 ppm of platinum group metal results in no appreciable increase in cure rate, and is therefore uneconomical.

According to a second embodiment, the hydrosilylation-curable silicone composition comprises (A') a silicone resin having the formula $(R^1R^5_2SiO_{1/2})_w(R^5_2SiO_{2/2})_x(R^5SiO_{3/2})_y(SiO_{4/2})_z$ (III), wherein $R^1$ is C1 to C10 hydrocarbyl or C1 to C10 halogen-substituted hydrocarbyl, both free of aliphatic unsaturation, $R^5$ is $R^1$ or —H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded hydrogen atoms per molecule; (B') an organosilicon compound having an average of at least two silicon-bonded alkenyl groups per molecule in an amount sufficient to cure the silicone resin; and (C) a catalytic amount of a hydrosilylation catalyst.

Component (A') is at least one silicone resin having the formula $(R^1R^5_2SiO_{1/2})_w(R^5_2SiO_{2/2})_x(R^5SiO_{3/2})_y(SiO_{4/2})_z$ (III), wherein $R^1$ is C1 to C10 hydrocarbyl or C1 to C10 halogen-substituted hydrocarbyl, both free of aliphatic unsaturation, $R^5$ is $R^1$ or —H, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin has an average of at least two silicon-bonded hydrogen atoms per molecule. In the formula (III), $R^1$, w, x, y, z, y+z/(w+x+y+z), and w+x/(w+x+y+z) are as described and exemplified above for the silicone resin having the formula (I).

Typically at least 50 mol %, alternatively at least 65 mol %, alternatively at least 80 mol % of the groups $R^5$ in the silicone resin are hydrogen.

The silicone resin typically has a number-average molecular weight (Mn) of from 500 to 50,000, alternatively from 500 to 10,000, alternatively 1,000 to 3,000, where the molecular weight is determined by gel permeation chromatography employing a low angle laser light scattering detector, or a refractive index detector and silicone resin (MQ) standards.

The viscosity of the silicone resin at 25° C. is typically from 0.01 to 100,000 Pa·s, alternatively from 0.1 to 10,000 Pa·s, alternatively from 1 to 100 Pa·s.

The silicone resin typically contains less than 10% (w/w), alternatively less than 5% (w/w), alternatively less than 2% (w/w), of silicon-bonded hydroxy groups, as determined by $^{29}$Si NMR.

The silicone resin contains $R^5SiO_{3/2}$ units (i.e., T units) and/or $SiO_{4/2}$ units (i.e., Q units) in combination with $R^1R^5_2SiO_{1/2}$ units (i.e., M units) and/or $R^5_2SiO_{2/2}$ units (i.e., D units). For example, the silicone resin can be a DT resin, an MT resin, an MDT resin, a DTQ resin, and MTQ resin, and MDTQ resin, a DQ resin, an MQ resin, a DTQ resin, an MTQ resin, or an MDQ resin.

Examples of silicone resins suitable for use as component (A') include, but are not limited to, resins having the following formulae:

$(HMe_2SiO_{1/2})_{0.25}(PhSiO_{3/2})_{0.75}$, $(HMeSiO_{2/2})_{0.3}(PhSiO_{3/2})_{0.6}(MeSiO_{3/2})_{0.1}$ and $(Me_3SiO_{1/2})_{0.1}(H_2SiO_{2/2})_{0.1}(MeSiO_{3/2})_{0.4}(PhSiO_{3/2})_{0.4}$, where Me is methyl, Ph is phenyl, and the numerical subscripts outside the parenthesis denote mole fractions. Also, in the preceding formulae, the sequence of units is unspecified.

Component (A') can be a single silicone resin or a mixture comprising two or more different silicone resins, each as described above.

Methods of preparing silicone resins containing silicon-bonded hydrogen atoms are well known in the art; many of these resins are commercially available. Silicone resins are typically prepared by cohydrolyzing the appropriate mixture of chlorosilane precursors in an organic solvent, such as toluene. For example, a silicone resin consisting essentially of $R^1R^5_2SiO_{1/2}$ units and $R^5SiO_{3/2}$ units can be prepared by cohydrolyzing a compound having the formula $R^1R^5_2SiCl$ and a compound having the formula $R^5SiCl_3$ in toluene, where $R^1$ and $R^5$ are as described and exemplified above. The aqueous hydrochloric acid and silicone hydrolyzate are separated and the hydrolyzate is washed with water to remove residual acid and heated in the presence of a mild non-basic condensation catalyst to "body" the resin to the requisite viscosity. If desired, the resin can be further treated with a non-basic condensation catalyst in an organic solvent to reduce the content of silicon-bonded hydroxy groups. Alternatively, silanes containing hydrolysable groups other than chloro, such —Br, —I, —OCH$_3$, —OC(O)CH$_3$, —N(CH$_3$)$_2$, NHCOCH$_3$, and —SCH$_3$, can be utilized as starting materials in the cohydrolysis reaction. The properties of the resin products depend on the types of silanes, the mole ratio of silanes, the degree of condensation, and the processing conditions.

Component (B') is at least one organosilicon compound having an average of at least two silicon-bonded alkenyl groups per molecule in an amount sufficient to cure the silicone resin of component (A').

The organosilicon compound contains an average of at least two silicon-bonded alkenyl groups per molecule, alternatively at least three silicon-bonded alkenyl groups per molecule. It is generally understood that cross-linking occurs when the sum of the average number of silicon-bonded hydrogen atoms per molecule in component (A') and the average number of silicon-bonded alkenyl groups per molecule in component (B') is greater than four.

The organosilicon compound can be an organosilane or an organosiloxane. The organosilane can be a monosilane, disilane, trisilane, or polysilane. Similarly, the organosiloxane can be a disiloxane, trisiloxane, or polysiloxane. The structure of the organosilicon compound can be linear, branched, cyclic, or resinous. Cyclosilanes and cyclosiloxanes typically have from 3 to 12 silicon atoms, alternatively from 3 to 10 silicon atoms, alternatively from 3 to 4 silicon atoms. In acyclic polysilanes and polysiloxanes, the silicon-bonded alkenyl groups can be located at terminal, pendant, or at both terminal and pendant positions.

Examples of organosilanes suitable for use as component (B') include, but are not limited to, silanes having the following formulae:

$Vi_4Si$, $PhSiVi_3$, $MeSiVi_3$, $PhMeSiVi_2$, $Ph_2SiVi_2$, and $PhSi(CH_2CH=CH_2)_3$, where Me is methyl, Ph is phenyl, and Vi is vinyl.

Examples of organosiloxanes suitable for use as component (B') include, but are not limited to, siloxanes having the following formulae:

$PhSi(OSiMe_2H)_3$, $Si(OSiMe_2H)_4$, $MeSi(OSiMe_2H)_3$, and $Ph_2Si(OSiMe_2H)_2$, where Me is methyl, and Ph is phenyl.

Component (B') can be a single organosilicon compound or a mixture comprising two or more different organosilicon compounds, each as described above. For example component (B') can be a single organosilane, a mixture of two different organosilanes, a single organosiloxane, a mixture of two different organosiloxanes, or a mixture of an organosilane and an organosiloxane.

The concentration of component (B') is sufficient to cure (cross-link) the silicone resin of component (A'). The exact amount of component (B') depends on the desired extent of cure, which generally increases as the ratio of the number of moles of silicon-bonded alkenyl groups in component (B') to the number of moles of silicon-bonded hydrogen atoms in component (A') increases. The concentration of component (B') is typically sufficient to provide from 0.4 to 2 moles of silicon-bonded alkenyl groups, alternatively from 0.8 to 1.5 moles of silicon-bonded alkenyl groups, alternatively from 0.9 to 1.1 moles of silicon-bonded alkenyl groups, per mole of silicon-bonded hydrogen atoms in component (A').

Methods of preparing organosilanes and organosiloxanes containing silicon-bonded alkenyl groups are well known in the art; many of these compounds are commercially available.

Component (C) of the second embodiment of the silicone composition is as described and exemplified above for component (C) of the first embodiment.

According to a third embodiment, the hydrosilylation-curable silicone composition comprises (A) a silicone resin having the formula $(R^1R^2_2SiO_{1/2})_w(R^2_2SiO_{2/2})_x(R^1SiO_{3/2})_y(SiO_{4/2})_z$ (I); (B) an organosilicon compound having an average of at least two silicon-bonded hydrogen atoms per molecule in an amount sufficient to cure the silicone resin; (C) a catalytic amount of a hydrosilylation catalyst; and (D) a silicone rubber having a formula selected from (i) $R^1R^2_2SiO(R^2_2SiO)_aSiR^2_2R^1$ (IV) and (ii) $R^5R^1_2SiO(R^1R^5SiO)_bSiR^1_2R^5$ (V); wherein $R^1$ is C1 to C10 hydrocarbyl or C1 to C10 halogen-substituted hydrocarbyl, both free of aliphatic unsaturation, $R^2$ is $R^1$ or alkenyl, $R^5$ is $R^1$ or —H, subscripts a and b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin and the silicone rubber (D)(i) each have an average of at least two silicon-bonded alkenyl groups per molecule, the silicone rubber (D)(ii) has an average of at least two silicon-bonded hydrogen atoms per molecule, and the mole ratio of silicon-bonded alkenyl groups or silicon-bonded hydrogen atoms in the silicone rubber (D) to silicon-bonded alkenyl groups in the silicone resin (A) is from 0.01 to 0.5.

Components (A), (B), and (C) of the third embodiment of the silicone composition are as described and exemplified above for the first embodiment.

The concentration of component (B) is sufficient to cure (cross-link) the silicone resin of component (A). When component (D) is (D)(i), the concentration of component (B) is such that the ratio of the number of moles of silicon-bonded hydrogen atoms in component (B) to the sum of the number of moles of silicon-bonded alkenyl groups in component (A) and component (D)(i) is typically from 0.4 to 2, alternatively from 0.8 to 1.5, alternatively from 0.9 to 1.1. Furthermore, when component (D) is (D)(ii), the concentration of component (B) is such that the ratio of the sum of the number of moles of silicon-bonded hydrogen atoms in component (B) and component (D)(ii) to the number of moles of silicon-bonded alkenyl groups in component (A) is typically from 0.4 to 2, alternatively from 0.8 to 1.5, alternatively from 0.9 to 1.1.

Component (D) is a silicone rubber having a formula selected from (i) $R^1R^2_2SiO(R^2_2SiO)_aSiR^2_2R^1$ (IV) and (ii) $R^5R^1_2SiO(R^1R^5SiO)_bSiR^1_2R^5$ (V); wherein $R^1$ is C1 to C10 hydrocarbyl or C1 to C10 halogen-substituted hydrocarbyl, both free of aliphatic unsaturation, $R^2$ is $R^1$ or alkenyl, $R^5$ is $R^1$ or —H, and subscripts a and b each have a value of from 1 to 4, provided the silicone rubber (D)(i) has an average of at least two silicon-bonded alkenyl groups per molecule, and the silicone rubber (D)(ii) has an average of at least two silicon-bonded hydrogen atoms per molecule.

Component (D)(i) is at least one silicone rubber having the formula $R^1R^2_2SiO(R^2_2SiO)_aSiR^2_2R^1$ (IV), wherein $R^1$ and $R^2$ are as described and exemplified above and the subscript a has a value of from 1 to 4, provided the silicone rubber (D)(i) has an average of at least two silicon-bonded alkenyl groups per molecule. Alternatively, the subscript a has a value of from 2 to 4 or from 2 to 3.

Examples of silicone rubbers suitable for use as component (D)(i) include, but are not limited to, silicone rubbers having the following formulae:

$ViMe_2SiO(Me_2SiO)_aSiMe_2Vi$, $ViMe_2SiO(Ph_2SiO)_aSiMe_2Vi$, and $ViMe_2SiO(PhMeSiO)_aSiMe_2Vi$, where Me is methyl, Ph is phenyl, Vi is vinyl, and the subscript a has a value of from 1 to 4.

Component (D)(i) can be a single silicone rubber or a mixture comprising two or more different silicone rubbers, each having the formula (IV).

Component (D)(ii) is at least one silicone rubber having the formula $R^5R^1_2SiO(R^1R^5SiO)_bSiR^1_2R^5$ (V); wherein $R^1$ and $R^5$ are as described and exemplified above, and the subscript b has a value of from 1 to 4, provided the silicone rubber (D)(ii) has an average of at least two silicon-bonded hydrogen atoms per molecule. Alternatively, the subscript b has a value of from 2 to 4 or from 2 to 3.

Examples of silicone rubbers suitable for use as component (D)(ii) include, but are not limited to, silicone rubbers having the following formulae:

$HMe_2SiO(Me_2SiO)_bSiMe_2H$, $HMe_2SiO(Ph_2SiO)_bSiMe_2H$, $HMe_2SiO(PhMeSiO)_bSiMe_2H$, and $HMe_2SiO(Ph_2SiO)_2(Me_2SiO)_2SiMe_2H$, where Me is methyl, Ph is phenyl, and the subscript b has a value of from 1 to 4.

Component (D)(ii) can be a single silicone rubber or a mixture comprising two or more different silicone rubbers, each having the formula (V).

The mole ratio of silicon-bonded alkenyl groups or silicon-bonded hydrogen atoms in the silicone rubber (D) to silicon-bonded alkenyl groups in the silicone resin (A) is typically from 0.01 to 0.5, alternatively from 0.05 to 0.4, alternatively from 0.1 to 0.3.

Methods of preparing silicone rubbers containing silicon-bonded alkenyl groups or silicon-bonded hydrogen atoms are well known in the art; many of these compounds are commercially available.

According to a fourth embodiment, the hydrosilylation-curable silicone composition comprises (A') a silicone resin having the formula $(R^1R^5{}_2SiO_{1/2})_w(R^5{}_2SiO_{2/2})_x(R^5SiO_{3/2})_y(SiO_{4/2})_z$ (III); (B') an organosilicon compound having an average of at least two silicon-bonded alkenyl groups per molecule in an amount sufficient to cure the silicone resin; (C) a catalytic amount of a hydrosilylation catalyst; and (D) a silicone rubber having a formula selected from (i) $R^1R^2{}_2SiO(R^2{}_2SiO)_aSiR^2{}_2R^1$ (IV) and (ii) $R^5R^1{}_2SiO(R^1R^5SiO)_bSiR^1{}_2R_5$ (V); wherein $R^1$ is C1 to C10 hydrocarbyl or C1 to C10 halogen-substituted hydrocarbyl, both free of aliphatic unsaturation, $R^2$ is $R^1$ or alkenyl, $R^5$ is $R^1$ or —H, subscripts a an b each have a value of from 1 to 4, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin and the silicone rubber (D)(ii) each have an average of at least two silicon-bonded hydrogen atoms per molecule, the silicone rubber (D)(i) has an average of at least two silicon-bonded alkenyl groups per molecule, and the mole ratio of silicon-bonded alkenyl groups or silicon-bonded hydrogen atoms in the silicone rubber (D) to silicon-bonded hydrogen atoms in the silicone resin (A') is from 0.01 to 0.5.

Components (A'), (B'), and (C) of the fourth embodiment of the silicone composition are as described and exemplified above for the second embodiment, and component (D) of the fourth embodiment is as described and exemplified above for the third embodiment.

The concentration of component (B') is sufficient to cure (cross-link) the silicone resin of component (A'). When component (D) is (D)(i), the concentration of component (B') is such that the ratio of the sum of the number of moles of silicon-bonded alkenyl groups in component (B') and component (D)(i) to the number of moles of silicon-bonded hydrogen atoms in component (A') is typically from 0.4 to 2, alternatively from 0.8 to 1.5, alternatively from 0.9 to 1.1. Furthermore, when component (D) is (D)(ii), the concentration of component (B') is such that the ratio of the number of moles of silicon-bonded alkenyl groups in component (B') to the sum of the number of moles of silicon-bonded hydrogen atoms in component (A') and component (D)(ii) is typically from 0.4 to 2, alternatively from 0.8 to 1.5, alternatively from 0.9 to 1.1.

The mole ratio of silicon-bonded alkenyl groups or silicon-bonded hydrogen atoms in the silicone rubber (D) to silicon-bonded hydrogen atoms in the silicone resin (A') is typically from 0.01 to 0.5, alternatively from 0.05 to 0.4, alternatively from 0.1 to 0.3.

According to a fifth embodiment, the hydrosilylation-curable silicone composition comprises (A") a rubber-modified silicone resin prepared by reacting a silicone resin having the formula $(R^1R^2{}_2SiO_{1/2})_w(R^2{}_2SiO_{2/2})_x(R^1SiO_{3/2})_y(SiO_{4/2})_z$ (I) and a silicone rubber having the formula $R^5R^1{}_2SiO(R^1R^5SiO)_cSiR^1{}_2R^5$ (VI) in the presence of a hydrosilylation catalyst and, optionally, an organic solvent to form a soluble reaction product, wherein $R^1$ is C1 to C10 hydrocarbyl or C1 to C10 halogen-substituted hydrocarbyl, both free of aliphatic unsaturation, $R^2$ is $R^1$ or alkenyl, $R^5$ is $R^1$ or —H, c has a value of from greater than 4 to 1,000, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (I) has an average of at least two silicon-bonded alkenyl groups per molecule, the silicone rubber (VI) has an average of at least two silicon-bonded hydrogen atoms per molecule, and the mole ratio of silicon-bonded hydrogen atoms in the silicone rubber (VI) to silicon-bonded alkenyl groups in silicone resin (I) is from 0.01 to 0.5; (B) an organosilicon compound having an average of at least two silicon-bonded hydrogen atoms per molecule in an amount sufficient to cure the rubber-modified silicone resin; and (C) a catalytic amount of a hydrosilylation catalyst.

Components (B) and (C) of the fifth embodiment of the silicone composition are as described and exemplified above for the first embodiment.

The concentration of component (B) is sufficient to cure (cross-link) the rubber-modified silicone resin. The concentration of component (B) is such that the ratio of the sum of the number of moles of silicon-bonded hydrogen atoms in component (B) and the silicone rubber (VI) to the number of moles of silicon-bonded alkenyl groups in the silicone resin (I) is typically from 0.4 to 2, alternatively from 0.8 to 1.5, alternatively from 0.9 to 1.1.

Component (A") is a rubber-modified silicone resin prepared by reacting at least one silicone resin having the formula $(R^1R^2{}_2SiO_{1/2})_w(R^2{}_2SiO_{2/2})_x(R^1SiO_{3/2})_y(SiO_{4/2})_z$ (I) and at least one silicone rubber having the formula $R^5R^1{}_2SiO(R^1R^5SiO)_cSiR^1{}_2R^5$ (VI) in the presence of a hydrosilylation catalyst and, optionally, an organic solvent to form a soluble reaction product, wherein $R^1$, $R^2$, $R^5$, w, x, y, z, y+z/(w+x+y+z), and w+x/(w+x+y+z) are as described and exemplified above, and the subscript c has a value of from greater than 4 to 1,000.

The silicone resin having the formula (I) is as described and exemplified above for the first embodiment of the silicone composition. Also, the hydrosilylation catalyst and organic solvent are as described and exemplified above in the method of preparing the organohydrogenpolysiloxane resin having the formula (II). As used herein the term "soluble reaction product" means when organic solvent is present, the product of the reaction for preparing component (A") is miscible in the organic solvent and does not form a precipitate or suspension.

In the formula (VI) of the silicone rubber, $R^1$ and $R^5$ are as described and exemplified above, and the subscript c typically has a value of from greater than 4 to 1,000, alternatively from 10 to 500, alternatively from 10 to 50.

Examples of silicone rubbers having the formula (VI) include, but are not limited to, silicone rubbers having the following formulae:
$HMe_2SiO(Me_2SiO)_{50}SiMe_2H$, $HMe_2SiO(Me_2SiO)_{10}SiMe_2H$, $HMe_2SiO(PhMeSiO)_{25}SiMe_2H$, and $Me_3SiO(MeHSiO)_{10}SiMe_3$, wherein Me is methyl, Ph is phenyl, and the numerical subscripts indicate the number of each type of siloxane unit.

The silicone rubber having the formula (VI) can be a single silicone rubber or a mixture comprising two or more different silicone rubbers, each having the formula (VI).

Methods of preparing silicone rubbers containing silicon-bonded hydrogen atoms are well known in the art; many of these compounds are commercially available.

The silicone resin (I), silicone rubber (VI), hydrosilylation catalyst, and organic solvent can be combined in any order. Typically, the silicone resin, silicone rubber, and organic solvent are combined before the introduction of the hydrosilylation catalyst.

The reaction is typically carried out at a temperature of from room temperature (~23±2° C.) to 150° C., alternatively from room temperature to 100° C.

The reaction time depends on several factors, including the structures of the silicone resin and the silicone rubber, and the temperature. The components are typically allowed to react for a period of time sufficient to complete the hydrosilylation reaction. This means the components are typically allowed to react until at least 95 mol %, alternatively at least 98 mol %, alternatively at least 99 mol %, of the silicon-bonded hydrogen atoms originally present in the silicone rubber have been consumed in the hydrosilylation reaction, as determined by FTIR spectrometry. The time of reaction is typically from 0.5 to 24 h at a temperature of from room temperature (~23±2° C.) to 100° C. The optimum reaction time can be determined by routine experimentation using the methods set forth in the Examples section below.

The mole ratio of silicon-bonded hydrogen atoms in the silicone rubber (VI) to silicon-bonded alkenyl groups in the silicone resin (I) is typically from 0.01 to 0.5, alternatively from 0.05 to 0.4, alternatively from 0.1 to 0.3.

The concentration of the hydrosilylation catalyst is sufficient to catalyze the addition reaction of the silicone resin (I) with the silicone rubber (VI). Typically, the concentration of the hydrosilylation catalyst is sufficient to provide from 0.1 to 1000 ppm of a platinum group metal, based on the combined weight of the resin and the rubber.

The concentration of the organic solvent is typically from 0 to 95% (w/w), alternatively from 10 to 75% (w/w), alternatively from 40 to 60% (w/w), based on the total weight of the reaction mixture.

The rubber-modified silicone resin can be used without isolation or purification in the fifth embodiment of the hydrosilylation-curable silicone composition or the resin can be separated from most of the solvent by conventional methods of evaporation. For example, the reaction mixture can be heated under reduced pressure. Moreover, when the hydrosilylation catalyst is a supported catalyst, described above, the rubber-modified silicone resin can be readily separated from the hydrosilylation catalyst by filtering the reaction mixture. However, when the rubber-modified silicone resin is not separated from the hydrosilylation catalyst used to prepare the resin, the catalyst may be used as component (C) of the fifth embodiment of the hydrosilylation-curable silicone composition.

According to a sixth embodiment, the hydrosilylation-curable silicone composition comprises (A''') a rubber-modified silicone resin prepared by reacting a silicone resin having the formula $(R^1R^5{}_2SiO_{1/2})_w(R^5{}_2SiO_{2/2})_x(R^5SiO_{3/2})_y(SiO_{4/2})_z$ (III) and a silicone rubber having the formula $R^1R^2{}_2SiO(R^2{}_2SiO)_dSiR^2{}_2R^1$ (VII) in the presence of a hydrosilylation catalyst and, optionally, an organic solvent to form a soluble reaction product, wherein $R^1$ is C1 to C10 hydrocarbyl or C1 to C10 halogen-substituted hydrocarbyl, both free of aliphatic unsaturation, $R^2$ is $R^1$ or alkenyl, $R^5$ is $R^1$ or —H, subscript d has a value of from greater than 4 to 1,000, w is from 0 to 0.8, x is from 0 to 0.6, y is from 0 to 0.99, z is from 0 to 0.35, w+x+y+z=1, y+z/(w+x+y+z) is from 0.2 to 0.99, and w+x/(w+x+y+z) is from 0.01 to 0.8, provided the silicone resin (III) has an average of at least two silicon-bonded hydrogen atoms per molecule, the silicone rubber (VII) has an average of at least two silicon-bonded alkenyl groups per molecule, and the mole ratio of silicon-bonded alkenyl groups in the silicone rubber (VII) to silicon-bonded hydrogen atoms in the silicone resin (III) is from 0.01 to 0.5; (B') an organosilicon compound having an average of at least two silicon-bonded alkenyl groups per molecule in an amount sufficient to cure the rubber-modified silicone resin; and (C) a catalytic amount of a hydrosilylation catalyst.

Components (B') and (C) of the sixth embodiment of the silicone composition are as described and exemplified above for the second embodiment.

The concentration of component (B') is sufficient to cure (cross-link) the rubber-modified silicone resin. The concentration of component (B') is such that the ratio of the sum of the number of moles of silicon-bonded alkenyl groups in component (B') and the silicone rubber (VII) to the number of moles of silicon-bonded hydrogen atoms in the silicone resin (III) is typically from 0.4 to 2, alternatively from 0.8 to 1.5, alternatively from 0.9 to 1.1.

Component (A''') is a rubber-modified silicone resin prepared by reacting at least one silicone resin having the formula $(R^1R^5{}_2SiO_{1/2})_w(R^5{}_2SiO_{2/2})_x(R^5SiO_{3/2})_y(SiO_{4/2})_z$ (III) and at least one silicone rubber having the formula $R^1R^2{}_2SiO(R^2{}_2SiO)_dSiR^2{}_2R^1$ (VII) in the presence of a hydrosilylation catalyst and an organic solvent to form a soluble reaction product, wherein $R^1$, $R^2$, $R^5$, w, x, y, z, y+z/(w+x+y+z), and w+x/(w+x+y+z) are as described and exemplified above, and the subscript d has a value of from greater than 4 to 1,000.

The silicone resin having the formula (III) is as described and exemplified above for the second embodiment of the hydrosilylation-curable silicone composition. Also, the hydrosilylation catalyst and organic solvent are as described and exemplified above in the method of preparing the organohydrogenpolysiloxane resin having the formula (II). As in the previous embodiment of the silicone composition, the term "soluble reaction product" means when organic solvent is present, the product of the reaction for preparing component (A') is miscible in the organic solvent and does not form a precipitate or suspension.

In the formula (VII) of the silicone rubber, $R^1$ and $R^2$ are as described and exemplified above, and the subscript d typically has a value of from 4 to 1,000, alternatively from 10 to 500, alternatively form 10 to 50.

Examples of silicone rubbers having the formula (VII) include, but are not limited to silicone rubbers having the following formulae:
ViMe$_2$SiO(Me$_2$SiO)$_{50}$SiMe$_2$Vi, ViMe$_2$SiO(Me$_2$SiO)$_{10}$SiMe$_2$Vi, ViMe$_2$SiO(PhMeSiO)$_{25}$SiMe$_2$Vi, and Vi$_2$MeSiO(PhMeSiO)$_{25}$SiMe$_2$Vi, wherein Me is methyl, Ph is phenyl, Vi is vinyl, and the numerical subscripts indicate the number or each type of siloxane unit.

The silicone rubber having the formula (VII) can be a single silicone rubber or a mixture comprising two or more different silicone rubbers, each having the formula (VII).

Methods of preparing silicone rubbers containing silicon-bonded alkenyl groups are well known in the art; many of these compounds are commercially available.

The reaction for preparing component (A''') can be carried out in the manner described above for preparing component (A'') of the fifth embodiment of the silicone composition, except the silicone resin having the formula (I) and the silicone rubber having the formula (VI) are replaced with the resin having the formula (III) and the rubber having the formula (VII), respectively. The mole ratio of silicon-bonded alkenyl groups in the silicone rubber (VII) to silicon-bonded hydrogen atoms in the silicone resin (III) is from 0.01 to 0.5, alternatively from 0.05 to 0.4, alternatively from 0.1 to 0.3. Moreover, the silicone resin and the silicone rubber are typically allowed to react for a period of time sufficient to complete the hydrosilylation reaction. This means the components are typically allowed to react until at least 95 mol %, alternatively at least 98 mol %, alternatively at least 99 mol %, of the silicon-bonded alkenyl groups originally present in the rubber have been consumed in the hydrosilylation reaction, as determined by FUR spectrometry.

The hydrosilylation-curable silicone composition of the present method can comprise additional ingredients, provided the ingredient does not prevent the silicone composition from curing to form a cured silicone resin having low coefficient of thermal expansion, high tensile strength, and high modulus, as described below. Examples of additional ingredients include, but are not limited to, hydrosilylation catalyst inhibitors, such as 3-methyl-3-penten-1-yne, 3,5-dimethyl-3-hexen-1-yne, 3,5-dimethyl-1-hexyn-3-ol, 1-ethynyl-1-cyclohexanol, 2-phenyl-3-butyn-2-ol, vinylcyclosiloxanes, and triphenylphosphine; adhesion promoters, such as the adhesion promoters taught in U.S. Pat. Nos. 4,087, 585 and 5,194,649; dyes; pigments; anti-oxidants; heat stabilizers; UV stabilizers; flame retardants; flow control additives; and diluents, such as organic solvents and reactive diluents.

For example, the hydrosilylation-curable silicone composition can contain (E) a reactive diluent comprising (i) an organosiloxane having an average of at least two silicon-bonded alkenyl groups per molecule and a viscosity of from 0.001 to 2 Pa·s at 25° C., wherein the viscosity of (E)(i) is not greater than 20% of the viscosity of the silicone resin, e.g., component (A), (A'), (A"), or (A''') above, of the silicone composition and the organosiloxane has the formula $(R^1R^2{}_2SiO_{1/2})_m(R^2{}_2SiO_{2/2})_n(R^1SiO_{3/2})_p(SiO_{4/2})_q$, wherein $R^1$ is C1 to C10 hydrocarbyl or C1 to C10 halogen-substituted hydrocarbyl, both free of aliphatic unsaturation, $R^2$ is $R^1$ or alkenyl, m is 0 to 0.8, n=0 to 1, p=0 to 0.25, q=0 to 0.2, m+n+p+q=1, and m+n is not equal to 0, provided when p+q=0, n is not equal to 0 and the alkenyl groups are not all terminal, and (ii) an organohydrogensiloxane having an average of at least two silicon-bonded hydrogen atoms per molecule and a viscosity of from 0.001 to 2 Pa·s at 25° C., in an amount sufficient to provide from 0.5 to 3 moles of silicon-bonded hydrogen atoms in (E)(ii) per mole of alkenyl groups in (E)(i), wherein the organohydrogensiloxane has the formula $(HR^1{}_2SiO_{1/2})_s(R^1SiO_{3/2})_t(SiO_{4/2})_v$, wherein $R^1$ is C1 to C10 hydrocarbyl or C1 to C10 halogen-substituted hydrocarbyl, both free of aliphatic unsaturation, s is from 0.25 to 0.8, t is from 0 to 0.5, v is from 0 to 0.3, s+t+v=1, and t+v is not equal to 0.

Component (E)(i) is at least one organosiloxane having an average of at least two alkenyl groups per molecule and a viscosity of from 0.001 to 2 Pa·s at 25° C., wherein the viscosity of (E)(i) is not greater than 20% of the viscosity of the silicone resin of the silicone composition and the organosiloxane has the formula $(R^1R^2{}_2SiO_{1/2})_m(R^2{}_2SiO_{2/2})_n(R^1SiO_{3/2})_p(SiO_{4/2})_q$, wherein $R^1$ is C1 to C10 hydrocarbyl or C1 to C10 halogen-substituted hydrocarbyl, both free of aliphatic unsaturation, $R^2$ is $R^1$ or alkenyl, m is 0 to 0.8, n=0 to 1, p=0 to 0.25, q=0 to 0.2, m+n+p+q=1, and m+n is not equal to 0, provided when p+q=0, n is not equal to 0 and the alkenyl groups are not all terminal (i.e., not all the alkenyl groups in the organosiloxane are in the $R^1R^2{}_2SiO_{1/2}$ units). Further, organosiloxane (E)(i) can have a linear, branched, or cyclic structure. For example, when the subscipts m, p, and q in the formula of organosiloxane (E)(i) are each equal to 0, the organosiloxane is an organocyclosiloxane.

The viscosity of organosiloxane (E)(i) at 25° C. is typically from 0.001 to 2 Pa·s, alternatively from 0.001 to 0.1 Pa·s, alternatively from 0.001 to 0.05 Pa·s. Further, the viscosity of organosiloxane (E)(i) at 25° C. is typically not greater than 20%, alternatively not greater than 10%, alternatively not greater than 1%, of the viscosity of the silicone resin in the hydrosilylation-curable silicone composition.

Examples of organosiloxanes suitable for use as organosiloxane (E)(i) include, but are not limited to, organosiloxanes having the following formulae:

$(ViMeSiO)_3$, $(ViMeSiO)_4$, $(ViMeSiO)_5$, $(ViMeSiO)_6$, $(ViPhSiO)_3$, $(ViPhSiO)_4$, $(ViPhSiO)_5$, $(ViPhSiO)_6$, $ViMe_2SiO(ViMeSiO)_nSiMe_2Vi$, $Me_3SiO(ViMeSiO)_nSiMe_3$, and $(ViMe_2SiO)_4Si$, where Me is methyl, Ph is phenyl, Vi is vinyl, and the subscript n has a value such that the organosiloxane has a viscosity of from 0.001 to 2 Pa·s at 25° C.

Component (E)(i) can be a single organosiloxane or a mixture comprising two or more different organosiloxanes, each as described above. Methods of making alkenyl-functional organosiloxanes are well known in the art.

Component (E)(ii) is at least one organohydrogensiloxane having an average of at least two silicon-bonded hydrogen atoms per molecule and a viscosity of from 0.001 to 2 Pa·s at 25° C., in an amount sufficient to provide from 0.5 to 3 moles of silicon-bonded hydrogen atoms in (E)(ii) to moles of alkenyl groups in (E)(i), wherein the organohydrogensiloxane has the formula $(HR^1{}_2SiO_{1/2})_s(R^1SiO_{3/2})_t(SiO_{4/2})_v$, wherein $R^1$ is C1 to C10 hydrocarbyl or C1 to C10 halogen-substituted hydrocarbyl, both free of aliphatic unsaturation, s is from 0.25 to 0.8, t is from 0 to 0.5, v is from 0 to 0.3, s+t+v=1, and t+v is not equal to 0.

The viscosity of organohydrogensiloxane (E)(ii) at 25° C. is typically from 0.001 to 2 Pa·s, alternatively from 0.001 to 0.1 Pa·s, alternatively from 0.001 to 0.05 Pa·s.

Examples of organohydrogensiloxanes suitable for use as organohydrogensiloxane (E)(ii) include, but are not limited to, organohydrogensiloxanes having the following formulae:

$PhSi(OSiMe_2H)_3$, $Si(OSiMe_2H)_4$, $MeSi(OSiMe_2H)_3$, $(HMe_2SiO)_3SiOSi(OSiMe_2H)_3$, and $(HMe_2SiO)_3SiOSi(Ph)(OSiMe_2H)_2$, where Me is methyl and Ph is phenyl.

Component (E)(ii) can be a single organohydrogensiloxane or a mixture comprising two or more different organohydrogensiloxanes, each as described above. Methods of making organohydrogensiloxanes are well known in the art.

The concentration of component (E)(ii) is sufficient to provide from 0.5 to 3 moles of silicon-bonded hydrogen atoms, alternatively from 0.6 to 2 moles of silicon-bonded hydrogen atoms, alternatively from 0.9 to 1.5 moles of silicon-bonded hydrogen atoms, per mole of alkenyl groups in component (E)(i).

The concentration of the reactive diluent (E), component (E)(i) and (E)(ii) combined, in the hydrosilylation-curable silicone composition is typically from 0 to 90% (w/w), alternatively from 0 to 50% (w/w), alternatively from 0 to 20% (w/w), alternatively from 0 to 10% (w/w), based on the combined weight of the silicone resin, component (A), (A'), (A"), or (A'''), and the organosilicon compound, component (B) or (B') in the embodiments above.

The silicone composition can be a one-part composition comprising the silicone resin, organosilicon compound, and hydrosilylation catalyst in a single part or, alternatively, a multi-part composition comprising these components in two or more parts. For example, a multi-part silicone composition can comprise a first part containing a portion of the silicone resin and all of the hydrosilylation catalyst, and a second part containing the remaining portion of the silicone resin and all of the organosilicon compound.

The one-part silicone composition is typically prepared by combining the principal components and any optional ingredients in the stated proportions at ambient temperature, with or without the aid of an organic solvent. Although the order of addition of the various components is not critical if the silicone composition is to be used immediately, the hydrosilylation catalyst is preferably added last at a temperature below about 30° C. to prevent premature curing of the composition. Also, the multi-part silicone composition can be prepared by combining the components in each part.

Mixing can be accomplished by any of the techniques known in the art such as milling, blending, and stirring, either in a batch or continuous process. The particular device is determined by the viscosity of the components and the viscosity of the final silicone composition.

Figure 2B:
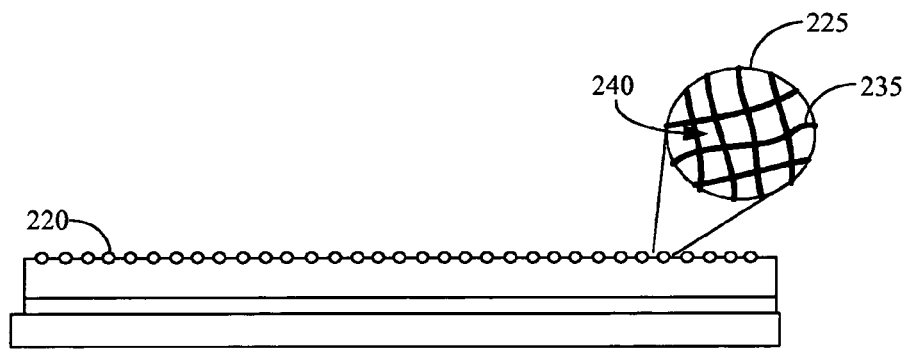

Referring now to FIG. 2B, a fibrous material 220 may be placed in or on the film of curable silicon-containing composition 215. As shown in the inset 225, the fibrous material 220 may include individual fibers 230 separated by openings 235. Accordingly, the fibers 230 may be in, on, or above the film of curable silicon-containing composition 215 and the openings 235 may or may not be impregnated by portions of the film of curable silicon-containing composition 215. In one embodiment, the fibrous material 220 is a glass fabric. For example, a Style 106 glass fabric piece, measuring 8"×8", supplied by BGF Industries may be placed in or on the film of curable silicon-containing composition 215. However, persons of ordinary skill in the art should appreciate that the present invention is not limited to the glass fabric.

In alternative embodiments, the fibrous material 220 can be any material comprising fibers 225, provided the material has a high modulus and high tensile strength. For example, the fibrous material 220 may have a Young's modulus at 25° C. of at least 3 GPa. For example, the fibrous material 220 may have a Young's modulus at 25° C. of from 3 to 1,000 GPa, alternatively from 3 to 200 GPa, alternatively from 10 to 100 GPa. Moreover, the fibrous material 220 may have a tensile strength at 25° C. of at least 50 MPa. For example, the fibrous material 220 may have a tensile strength at 25° C. of from 50 to 10,000 MPa, alternatively from 50 to 1,000 MPa, alternatively from 50 to 500 MPa.

The fibrous material 220 can be a woven fabric, e.g., a cloth; a nonwoven fabric, e.g., a mat or roving; or loose (individual) fibers. The fibers in the fibrous material 220 are typically cylindrical in shape and have a diameter of from 1 to 100 μm, alternatively from 1 to 20 μm, alternatively from 1 to 10 μm. Loose fibers may be continuous, meaning the fibers extend throughout the reinforced silicone resin film in a generally unbroken manner, or chopped. The fibrous material 220 may be heat-treated prior to use to remove organic contaminants. For example, the fibrous material 220 may be heated in air at an elevated temperature, for example, 575° C., for a suitable period of time, for example 2 h. Examples of fibrous material 220 include, but are not limited to reinforcements comprising glass fibers; quartz fibers; graphite fibers; nylon fibers; polyester fibers; aramid fibers, such as Kevlar® and Nomex®; polyethylene fibers; polypropylene fibers; and silicon carbide fibers.

The fibrous material 220 can be embedded in the film of curable silicon-containing composition 215 by simply placing the fibrous material 220 on the film of curable silicon-containing composition 215 and allowing the silicone composition of the film of curable silicon-containing composition 215 to saturate the fibrous material 220. In one embodiment, the embedded fibrous material 220 is degassed. The embedded fibrous material 220 can be degassed by subjecting it to a vacuum at a temperature of from room temperature (~23±2° C.) to 60° C., for a period of time sufficient to remove entrapped air in the embedded reinforcement. For example, the embedded fibrous material 220 can typically be degassed by subjecting it to a pressure of from 1,000 to 20,000 Pa for 5 to 60 min. at room temperature.

Figure 2C:
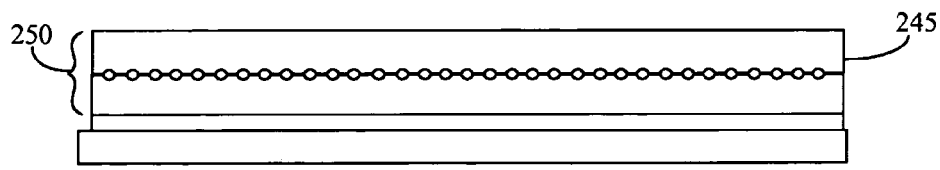
Figure 2D:
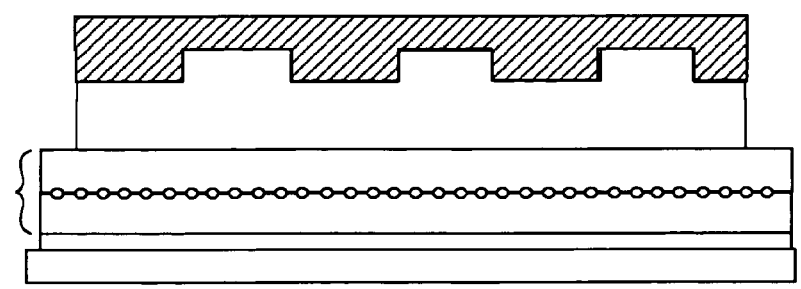

Referring now to FIG. 2C, a film of curable silicon-containing composition 245 may then be applied to the film 215 and the impregnated fibrous material 220. The film 245 may be applied using the conventional techniques described above. The film 215, the impregnated fiber is material 220, and the film 245 may be referred to collectively as a support layer 250. In one embodiment, the support layer 250 may be compressed to remove excess silicone composition and/or entrapped air, and to reduce the thickness of the support layer 250. The support layer 250 can be compressed using conventional equipment such as a stainless steel roller, hydraulic press, rubber roller, or laminating roll set. The support layer 250 is typically compressed at a pressure of from 1,000 Pa to 10 MPa and at a temperature of from room temperature (~23±2° C.) to 50° C. In one embodiment, the support layer 250 may then be cured or partially cured using any of the techniques described above.

A patterned mold 255 may then be formed adjacent the support layer 250. In the illustrated embodiment, the patterned mold 255 is formed by depositing a curable silicon-containing composition, which may or may not be the same as the composition for layers 215 and 245, adjacent the support layer 250 and allowing the composition to at least partially cure. For example, Sylgard 184 and an appropriate crosslinker, which may be supplied by Dow Corning Corporation as a kit, may be mixed to form the curable silicon-containing composition. A square metal frame (not shown) may be placed on the partially cured support layer 250. In one embodiment, the thickness of the frame is 2.0 mm. However, the thickness of the frame is a matter of design choice and not material to the present invention, although the thickness may be determined by the desired thickness of the elastomeric layer of the mold 255. In one embodiment, the inner opening of the frame is a square measuring at 6"×6". However, the size of the opening of the frame is a matter of design choice and not material to the present invention, although the size of the opening may be determined by the desired size and shape of the patterning area in the subsequent printing or other patterning steps. The catalyzed Sylgard 184 may be poured into the opening of the frame and left at room temperature for half an hour to self degas.

A master 260 may then be brought into contact with the curable silicon-containing composition that will be used to form the mold 255. For example, a silicon wafer with engraved patterns on one side may be placed in contact with the curable silicon-containing composition such that the engraved pattern faces into the curable silicon-containing composition. In one embodiment, slight pressure may be applied on the back of the master 260, although one or more edges of the master 260 may be sitting on the metal frame described above. The whole assembly may be cured, e.g. in an air circulating oven at 150° C. for 10 minutes.

Figure 2E:
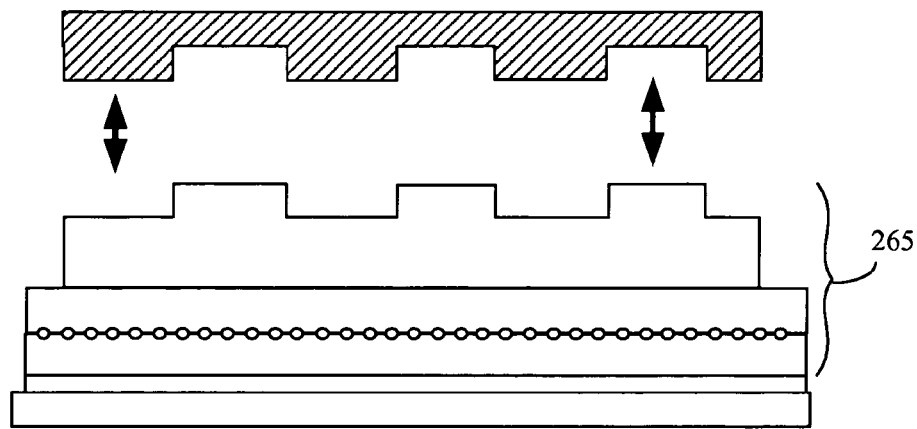
Figure 2F:
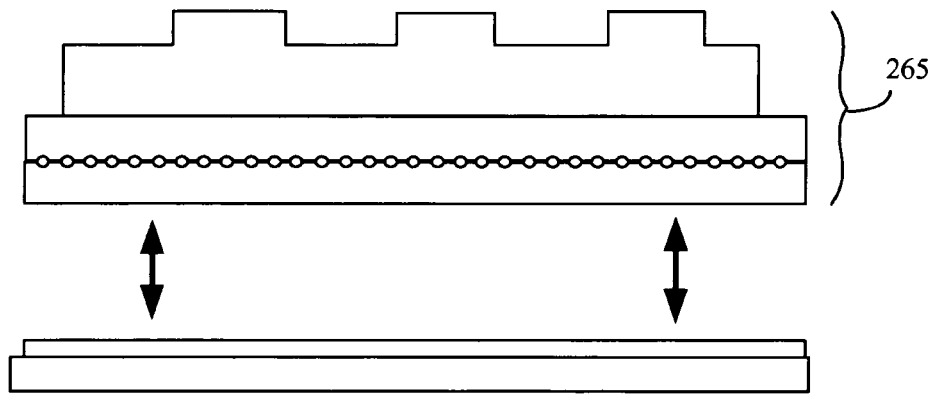

The cured mold assembly 265, which may include the mold 255 and the support layer 250, may be separated from the master 260 and the treated substrate 205. In the illustrated embodiment, the master 260 is first removed from the mold 255, as shown in FIG. 2E and then the mold assembly 265 is released from the treated substrate 205, as shown in FIG. 2F. For example, the mold assembly 265 may be peeled off of the treated substrate 205. If a metal frame was present, then the metal frame may also be removed from the mold assembly 265. Persons of ordinary skill in the art having benefit of the present disclosure should appreciate that the particular sequence of events used to separate the mold assembly 265 from the master pattern 260 and the treated substrate 205 (and, if present, the metal frame or any other structures) is not material to the present invention and any sequence or technique for separating the mold assembly 265 may be used.

The coefficient of thermal expansion of the mold assembly 265 may be reduced by the presence of the fiber-reinforced support layer 250. For example, the coefficient of linear thermal expansion (CTE) of the composite silicon elastomer mold assembly 265 described above may be measured via a thermal mechanical analysis (TMA) method. For example, samples of the mold assembly 265 were examined for linear coefficient of thermal expansion using a TA Instruments 2940 TMA with macro expansion probe. Samples were cut and placed on the TMA sample stage, cooled to <−50° C., then heated to 200° C. at 5° C./min under a He atmosphere. Dimensional change was measured by vertical displacement of the macro expansion probe placed on a sample with a 1 g load. Only in-plane CTE values were measured. The coefficient of thermal expansion of the composite mold assembly 265 was found to range from about 5 to about 55 ppm per degree Celsius.

Figure 2G:
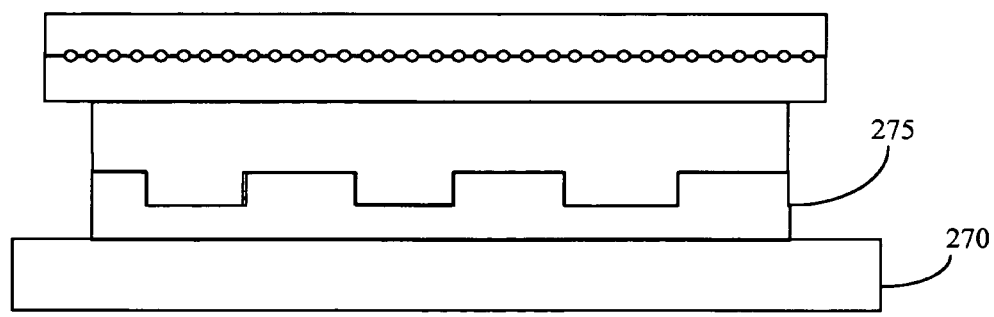

The mold assembly 265 may then be used to apply, transfer, or otherwise form a pattern corresponding to the master pattern 260 on a substrate 270, as shown in FIG. 2G. In one embodiment, the pattern is transferred to a UV curable arcylate film 275 that has been spin-coated on a silicon wafer 270. The mold assembly 265 is placed on top of the arcylate film 275. The UV light is shined through the mold assembly 265 and the arcylate coating 275 under it was cured. After the IJV cure, the mold assembly 265 was lifted from the film 275 so that the patterns on the mold assembly 265 are transferred to the cured acrylate mold 275. However, persons of ordinary skill in the art having benefit of the present disclosure should appreciate that the techniques used to apply, transfer, or form patterns in or on the substrate 270 or film 275 are matters of design choice and not material to the present invention.

Although the curable silicon-containing compositions described above with reference to FIGS. 2A-G may be Sylgard 184 and an appropriate cross-linker, the present invention is not limited to this curable silicon-containing composition. Examples of other curable silicone compositions that may be used include, but are not limited to, hydrosilylation-curable silicone compositions, peroxide curable silicone compositions, condensation-curable silicone compositions, epoxy-curable silicone compositions; ultraviolet radiation-curable silicone compositions, high-energy radiation-curable silicone compositions, and organo-silicone compositions with the same functionalities. The curable silicon compositions include monomers or polymers having curable or cross-linkable functionality, Examples of such polymers include, but are not limited to, polysiloxanes (linear, branched, resins, and the like), block copolymers containing segments of siloxane repeat units and organic repeat units, and silicon-modified polymers.

Curable silicone compositions and methods for their preparation are well known in the art. For example, a suitable hydrosilylation-curable silicone composition typically comprises (i) an organopolysiloxane containing an average of at least two silicon-bonded alkenyl groups per molecule, (ii) an organohydrogensiloxane containing an average of at least two silicon-bonded hydrogen atoms per molecule in an amount sufficient to cure the composition, and (iii) a hydrosilylation catalyst. The hydrosilylation catalyst can be any of the well known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

The hydrosilylation-curable silicone composition can be a one-part composition or a multi-part composition comprising the components in two or more parts. Room-temperature vulcanizable (RTV) compositions typically comprise two parts, one part containing the organopolysiloxane and catalyst and another part containing the organohydrogensiloxane and any optional ingredients. Hydrosilylation-curable silicone compositions that cure at elevated temperatures can be formulated as one-part or multi-part compositions. For example, liquid silicone rubber (LSR) compositions are typically formulated as two-part systems. One-part compositions typically contain a platinum catalyst inhibitor to ensure adequate shelf life.

A suitable peroxide-curable silicone composition typically comprises (i) an organopolysiloxane and (ii) an organic peroxide. Examples of organic peroxides include, diaroyl peroxides such as dibenzoyl peroxide, di-p-chlorobenzoyl peroxide, and bis-2,4-dichlorobenzoyl peroxide; dialkyl peroxides such as di-t-butyl peroxide and 2,5-dimethyl-2,5-di-(t-butylperoxy)hexane; diaralkyl peroxides such as dicumyl peroxide; alkyl aralkyl peroxides such as t-butyl cumyl peroxide and 1,4-bis(t-butylperoxyisopropyl)benzene; and alkyl aroyl peroxides such as t-butyl perbenzoate, t-butyl peracetate, and t-butyl peroctoate.

A condensation-curable silicone composition typically comprises (i) an organopolysiloxane containing an average of at least two hydroxy groups per molecule; and (ii) a tri- or tetra-functional silane containing hydrolysable Si—O or Si—N bonds. Examples of silanes include alkoxysilanes such as $CH_3Si(OCH_3)_3$, $CH_3Si(OCH_2CH_3)_3$, $CH_3Si(OCH_2CH_2CH_3)_3$, $CH_3Si[O(CH_2)_3CH_3]_3$, $CH_3CH_2Si(OCH_2CH_3)_3$, $C_6H_5Si(OCH_3)_3$, $C_6H_5CH_2Si(OCH_3)_3$, $C_6H_5Si(OCH_2CH_3)_3$, $CH_2\!=\!CHSi(OCH_3)_3$, $CH_2\!=\!CHCH_2Si(OCH_3)_3$, $CF_3CH_2CH_2Si(OCH_3)_3$, $CH_3Si(OCH_2CH_2OCH_3)_3$, $CF_3CH_2CH_2Si(OCH_2CH_2OCH_3)_3$, $CH_2\!=\!CHSi(OCH_2CH_2OCH_3)_3$, $CH_2\!=\!CHCH_2Si(OCH_2CH_2OCH_3)_3$, $C_6H_5Si(OCH_2CH_2OCH_3)_3$, $Si(OCH_3)_4$, $Si(OC_2H_5)_4$, and $Si(OC_3H_7)_4$; organoacetoxysilanes such as $CH_3Si(OCOCH_3)_3$, $CH_3CH_2Si(OCOCH_3)_3$, and $CH_2\!=\!CHSi(OCOCH_3)_3$; organoiminooxysilanes such as $CH_3Si[O\!-\!N\!=\!C(CH_3)CH_2CH_3]_3$, $Si[O\!-\!N\!=\!C(CH_3)CH_2CH_3]_4$, and $CH_2\!=\!CHSi[O\!-\!N\!=\!C(CH_3)CH_2CH_3]_3$; organoacetamidosilanes such as $CH_3Si[NHC(\!=\!O)CH_3]_3$ and $C_6H_5Si[NHC(\!=\!O)CH_3]_3$; aminosilanes such as $CH_3Si[NH(s-C_4H_9)]_3$ and $CH_3Si(NHC_6H_{11})_3$; and organoaminooxysilanes.

A condensation-curable silicone composition can also contain a condensation catalyst to initiate and accelerate the condensation reaction. Examples of condensation catalysts include, but are not limited to, amines; and complexes of lead, tin, zinc, and iron with carboxylic acids. Tin(II) octoates, laurates, and oleates, as well as the salts of dibutyl tin, are particularly useful. The condensation-curable silicone composition can be a one-part composition or a multi-part composition comprising the components in two or more parts. For example, room-temperature vulcanizable (RTV) compositions can be formulated as one-part or two-part compositions. In the two-part composition, one of the parts typically includes a small amount of water.

A suitable epoxy-curable silicone composition typically comprises (i) an organopolysiloxane containing an average of at least two epoxy-functional groups per molecule and (ii) a curing agent. Examples of epoxy-functional groups include 2-glycidoxyethyl, 3-glycidoxypropyl, 4-glycidoxybutyl, 2,(3,4-epoxycyclohexyl)ethyl, 3-(3,4-epoxycyclohexyl)propyl, 2,3-epoxypropyl, 3,4-epoxybutyl, and 4,5-epoxypentyl. Examples of curing agents include anhydrides such as phthalic anhydride, hexahydrophthalic anhydride, tetrahydrophthalic anhydride, and dodecenylsuccinic anhydride; polyamines such as diethyl enetri amine, triethylenetetramine, diethylenepropylamine, N-(2-hydroxyethyl)diethylenetriamine, N,N'-di(2-hydroxyethyl)diethylenetriamine, m-phenylenediamine, methylenedianiline, aminoethyl piperazine, 4,4-diaminodiphenyl sulfone, benzyldimethylamine, dicyandiamide, and 2-methylimidazole, and triethylamine; Lewis acids such as boron trifluoride monoethylamine; polycarboxylic acids; polymercaptans; polyamides; and amidoamines.

A suitable ultraviolet radiation-curable silicone composition typically comprises (i) an organopolysiloxane containing radiation-sensitive functional groups and (ii) a photoinitiator. Examples of radiation-sensitive functional groups include acryloyl, methacryloyl, mercapto, epoxy, and alkenyl ether groups. The type of photoinitiator depends on the nature of the radiation-sensitive groups in the organopolysiloxane. Examples of photoinitiators include diaryliodonium salts, sulfonium salts, acetophenone, benzophenone, and benzoin and its derivatives.

A suitable high-energy radiation-curable silicone composition comprises an organopolysiloxane polymer. Examples of organpolyosiloxane polymers include polydimethylsiloxanes, poly(methylvinylsiloxanes), and organohydrogenpolysiloxanes. Examples of high-energy radiation include y-rays and electron beams.

The curable silicone composition of the present invention can comprise additional ingredients. Examples of additional ingredients include, but are not limited to, adhesion promoters, solvents, inorganic fillers, photosensitizers, antioxidants, stabilizers, pigments, and surfactants. Examples of inorganic fillers include, but are not limited to, natural silicas such as crystalline silica, ground crystalline silica, and diatomaceous silica; synthetic silicas such as fused silica, silica gel, pyrogenic silica, and precipitated silica; silicates such as mica, wollastonite, feldspar, and nepheline syenite; metal oxides such as aluminum oxide, titanium dioxide, magnesium oxide, ferric oxide, beryllium oxide, chromium oxide, and zinc oxide; metal nitrides such as boron nitride, silicon nitride, and aluminum nitride, metal carbides such as boron carbide, titanium carbide, and silicon carbide; carbon black; alkaline earth metal carbonates such as calcium carbonate; alkaline earth metal sulfates such as calcium sulfate, magnesium sulfate, and barium sulfate; molybdenum disulfate; zinc sulfate; kaolin; talc; glass fiber; glass beads such as hollow glass microspheres and solid glass microspheres; aluminum trihydrate; asbestos; and metallic powders such as aluminum, copper, nickel, iron, and silver powders.

The silicone composition can be cured by exposure to ambient temperature, elevated temperature, moisture, or radiation, depending on the particular cure mechanism. For example, one-part hydrosilylation-curable silicone compositions are typically cured at an elevated temperature. Two-part hydrosilylation-curable silicone compositions are typically cured at room temperature or an elevated temperature. One-part condensation-curable silicone compositions are typically cured by exposure to atmospheric moisture at room temperature, although cure can be accelerated by application of heat and/or exposure to high humidity. Two-part condensation-curable silicone compositions are typically cured at room temperature; however, cure can be accelerated by application of heat. Peroxide-curable silicone compositions are typically cured at an elevated temperature. Epoxy-curable silicone compositions are typically cured at room temperature or an elevated temperature. Depending on the particular formulation, radiation-curable silicone compositions are typically cured by exposure to radiation, for example, ultraviolet light, gamma rays, or electron beams.

Figure 3A:
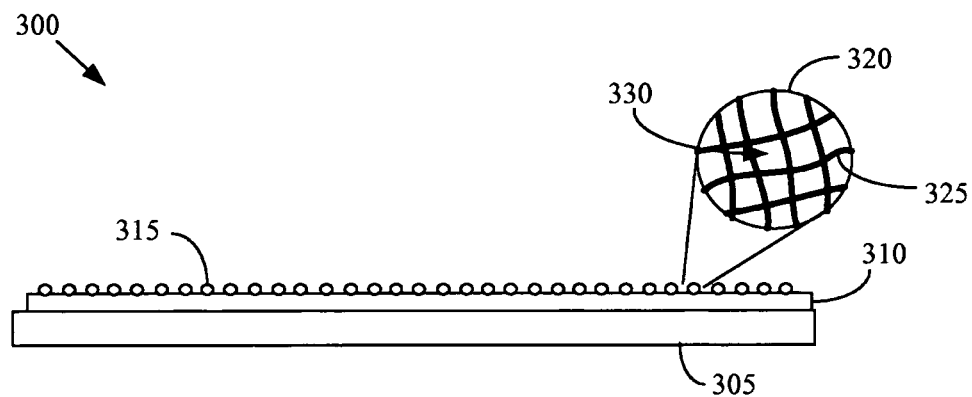
FIGS. 3A, 3B, and 3C conceptually illustrate a third exemplary embodiment of a method of forming a soft lithographic mold, in accordance with the present invention.
Figure 3B:
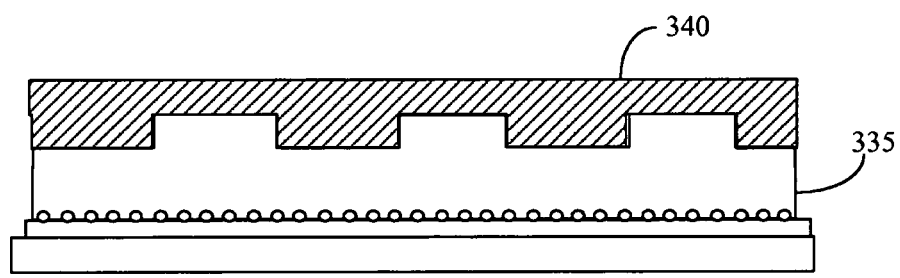
Figure 3C:
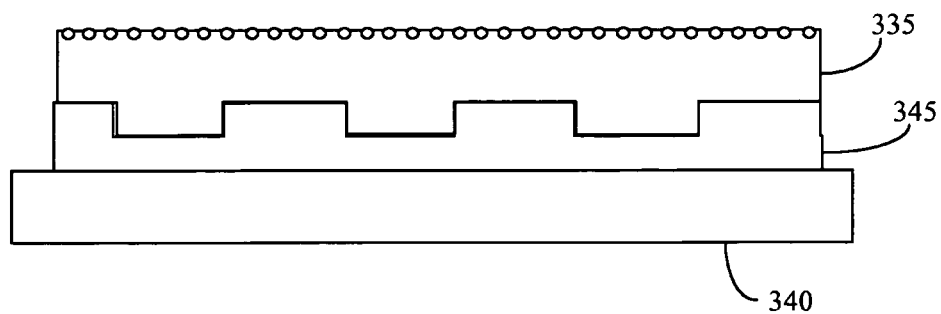

FIGS. 3A, 3B, and 3C conceptually illustrate a third exemplary embodiment of a method 300 of forming a soft lithographic mold. In the illustrated embodiment, a substrate 305 is treated to form a release layer 310 that is intended to decreased adherence of subsequently formed layers to the substrate 305 and to allow the subsequently formed layers to be released from the substrate 305. The release layer 310 can be any rigid or flexible material having a surface from which the reinforced silicone resin film can be removed without damage by delamination after the silicone resin is cured, as described below. Examples of release liners include, but are not limited to, Nylon, polyethyleneterephthalate, polyimide, PTFE, silicone, and sol gel coatings. For example, the substrate 305 may be a glass plate having dimensions of 6"×6" that is treated with Relisse® 2520, from Nanofilm, Inc of Valley View, Ohio to form the release layer 310. However, persons of ordinary skill in the art having benefit of the present disclosure should appreciate that any material may be used to form the substrate 305 and/or the release layer 310. Furthermore, the release layer 310 is optional and not necessary for the practice of the present invention.

A fibrous material 315 may be placed in or on the substrate 305 or, if present, the release layer 310, as shown in FIG. 3A. As shown in the inset 320, the fibrous material 315 may include individual fibers 325 separated by openings 330. Accordingly, the fibers 325 may be in, on, or above the substrate 305 or, if present, the release layer 310. In one embodiment, the fibrous material 315 is a glass fabric. For example, a Style 106 glass fabric piece, measuring 8"×8", supplied by BGF Industries may be placed in or on the substrate and 305 or, if present, the release layer 310. However, persons of ordinary skill in the art should appreciate that the present invention is not limited to the glass fabric. In alternative embodiments, the fibrous material 315 can be any material comprising fibers 325. Examples of alternative fibrous materials 315 are discussed in detail above.

A patterned mold 335 may then be formed over the fibrous material 315, the substrate 305 and, if present, the release layer 310. In the illustrated embodiment, the patterned mold 335 is formed by depositing a curable silicon-containing composition over the fibrous material 315, the substrate 305 and, if present, the release layer 310 using the deposition methods described above. The curable silicon-containing composition may then impregnate the fibrous material 315, as discussed in detail above. For example, Sylgard 184 and an appropriate crosslinker, which may be supplied by Dow Corning Corporation as a kit, may be mixed to form the curable silicon-containing composition. Although the curable silicon-containing compositions described with reference to FIGS. 3A-C may be Sylgard 184 and an appropriate crosslinker, the present invention is not limited to this curable silicon-containing composition. Examples of other curable silicone compositions that may be used are presented above.

To deposit the curable silicon-containing composition including Sylgard 184 and one or more crosslinkers, a square metal frame (not shown) may be placed on the over the fibrous material 315, the substrate 305 and, if present, the release layer 310. In one embodiment, the thickness of the frame is 2.0 mm. However, the thickness of the frame is a matter of design choice and not material to the present invention, although the thickness may be determined by the desired thickness of the elastomeric layer of the mold 255. In one embodiment, the inner opening of the frame is a square measuring at 6"×6". However, the size of the opening of the frame is a matter of design choice and not material to the present invention, although the size of the opening may be determined by the desired size and shape of the patterning area in the subsequent printing or other patterning steps. The catalyzed Sylgard 184 may be poured into the opening of the frame and left at room temperature for half an hour to self degas.

A master 340 may then be brought into contact with the curable silicon-containing composition that will be used to form the mold 335. For example, a silicon wafer with engraved patterns on one side may be placed in contact with the curable silicon-containing composition such that the engraved pattern faces into the curable silicon-containing composition. In one embodiment, slight pressure may be applied on the back of the master 340, although one or more edges of the master 340 may be sitting on the metal frame described above. The whole assembly may be cured, e.g. in an air circulating oven at 150° C. for 10 minutes.

The cured mold assembly 335, which includes the impregnated fibrous material 315, may then be separated from the master 340 and the treated substrate 305. If a metal frame was present, then the metal frame may also be removed from the mold assembly 335. Persons of ordinary skill in the art having benefit of the present disclosure should appreciate that the particular sequence of events used to separate the mold assembly 335 from the master pattern 340 and the treated substrate 305 (and, if present, the metal frame or any other structures) is not material to the present invention and any sequence or technique for separating the mold assembly 335 may be used.

The coefficient of thermal expansion of the mold assembly 335 may be reduced by the presence of the impregnated fibrous material 315. For example, the coefficient of linear thermal expansion (CTE) of the composite silicon elastomer mold assembly 335 described above may be measured via the TMA method. For example, samples of the mold assembly 335 were examined for linear coefficient of thermal expansion using a TA Instruments 2940 TMA with macro expansion probe. Samples were cut and placed on the TMA sample stage, cooled to <−50° C., then heated to 200° C. at 5° C./min under a He atmosphere. Dimensional change was measured by vertical displacement of the macro expansion probe placed on a sample with a 1 g load. Only in-plane CTE values were measured. The coefficient of thermal expansion of the composite mold assembly 335 was found to range from about 5 to about 55 ppm per degree Celsius.

The mold assembly 335 may then be used to apply, transfer, or otherwise form a pattern corresponding to the master pattern 340 on a substrate 345, as shown in FIG. 3C. In one embodiment, the pattern is transferred to a UV curable arcylate film 350 that has been spin-coated on a silicon wafer 345. The mold assembly 335 is placed on top of the arcylate film 350. The UV light is shined through the mold assembly 335 and the arcylate coating 350 under it was cured. After the UV cure, the mold assembly 335 was lifted from the film 350 so that the patterns on the mold assembly 335 are transferred to the cured acrylate mold 350. However, persons of ordinary skill in the art having benefit of the present disclosure should appreciate that the techniques used to apply, transfer, or form patterns in or on the substrate 345 or film 350 are matters of design choice and not material to the present invention.

Figure 4A:
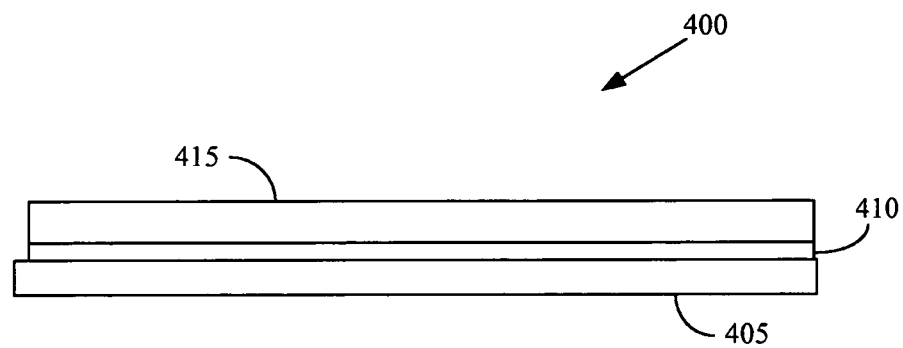
FIGS. 4A, 4B, and 4C conceptually illustrate a fourth exemplary embodiment of a method of forming a soft lithographic mold, in accordance with the present invention.
Figure 4B:
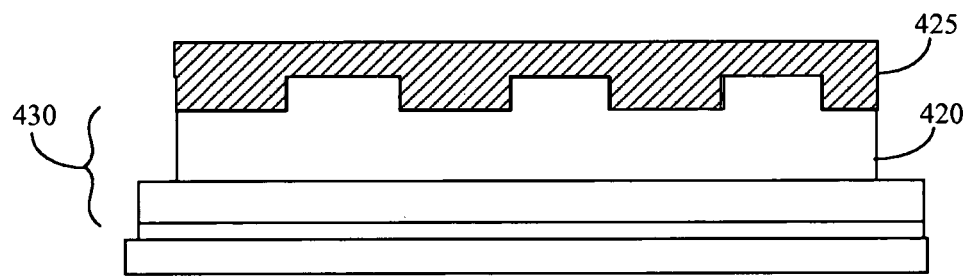
Figure 4C:
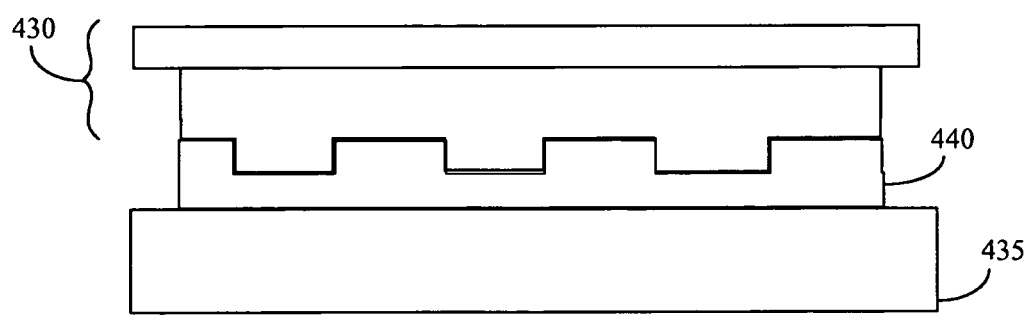

FIGS. 4A, 4B, and 4C conceptually illustrate a fourth exemplary embodiment of a method 400 of forming a soft lithographic mold. In the illustrated embodiment, a substrate 405 is treated to form a release layer 410 that is intended to decreased adherence of subsequently formed layers to the substrate 405 and to allow the subsequently formed layers to be released from the substrate 405. The release layer 410 can be any rigid or flexible material having a surface from which the reinforced silicone resin film can be removed without damage by delamination after the silicone resin is cured, as described below. Examples of release liners include, but are not limited to, Nylon, polyethyleneterephthalate, polyimide, PTFE, silicone, and sol gel coatings. For example, the substrate 405 may be a glass plate having dimensions of 6"×6" that is treated with Relisse® 2520, from Nanofilm, Inc of Valley View, Ohio to form the release layer 410. However, persons of ordinary skill in the art having benefit of the present disclosure should appreciate that any material may be used to form the substrate 405 and/or the release layer 410. Furthermore, the release layer 410 is optional and not necessary for the practice of the present invention.

A layer 415 of a curable solventless resin is then deposited over the substrate 405 or, if present, the release layer 410. Examples of resins that may be used to form the layer 415 are given above and the layer 415 may be deposited using any of the techniques described herein. In various embodiments, the curable solventless resin may be cast in a mold or a releasable substrate or coated onto a surface. The layer 415 may then be at least partially cured. For example, the layer 415 may be heated in an air circulating oven through the following process: 5° C./min. to 100° C., 100° C. stay for 1 h., 5° C./min. to 160° C., 160° C. stay for 1 h., 5° C./min. to 200° C., and 200° C. for 2 h. The resin layer 415 can also be a pre-cured resin film laid on substrate 405, or if present, release coating layer 410.

In the embodiment shown in FIG. 4B, a patterned mold 420 may then be formed adjacent the cured or partially cured layer 415. However, persons of ordinary skill in the art having benefit of the present disclosure should appreciate that the present invention is not limited to embodiments in which the patterned mold 420 is formed while the cured or partially cured layer 415 remains adjacent the substrate 405 or, if present, the release layer 410. In alternative embodiments, the cured or partially cured layer 415 may be removed from the substrate 405 or, if present, the release layer 410 prior to forming the patterned mold 420 adjacent the cured or partially cured layer 415.

In the illustrated embodiment, the patterned mold 420 is formed by depositing a curable silicon-containing composition adjacent layer 415 and allowing the composition to at least partially cure. For example, Sylgard 184 and an appropriate crosslinker, which may be supplied by Dow Corning Corporation as a kit, may be mixed to form the curable silicon-containing composition. A square metal frame (not shown) may be placed on the partially cured layer 415. In one embodiment, the thickness of the frame is 2.0 mm. However, the thickness of the frame is a matter of design choice and not material to the present invention, although the thickness may be determined by the desired thickness of the elastomeric layer of the mold 420. In one embodiment, the inner opening of the frame is a square measuring at 6"×6". However, the size of the opening of the frame is a matter of design choice and not material to the present invention, although the size of the opening may be determined by the desired size and shape of the patterning area in the subsequent printing or other patterning steps. The catalyzed Sylgard 184 may be poured into the opening of the frame and left at room temperature for half an hour to self degas.

A master 425 may then be brought into contact with the curable silicon-containing composition that will be used to form the mold 420. For example, a silicon wafer with engraved patterns on one side may be placed in contact with the curable silicon-containing composition such that the engraved pattern faces into the curable silicon-containing composition. In one embodiment, slight pressure may be applied on the back of the master 425, although one or more edges of the master 425 may be sitting on the metal frame described above. The whole assembly may be cured, e.g. in an air circulating oven at 150° C. for 10 minutes.

The cured mold assembly 430, which may include the mold 420 and the layer 415, may then be separated from the master 425 and the treated substrate 405. If a metal frame was present, then the metal frame may also be removed from the mold assembly 430. Persons of ordinary skill in the art having benefit of the present disclosure should appreciate that the particular sequence of events used to separate the mold assembly 430 from the master pattern 425 and the treated substrate 405 (and, if present, the metal frame or any other structures) is not material to the present invention and any sequence or technique for separating the mold assembly 430 may be used.

The coefficient of thermal expansion of the mold assembly 430 may be reduced by the presence of the layer 415. For example, the coefficient of linear thermal expansion (CTE) of the composite silicon elastomer mold assembly 430 described above may be measured via the TMA method. For example, samples of the mold assembly 430 were examined for linear coefficient of thermal expansion using a TA Instruments 2940 TMA with macro expansion probe. Samples were cut and placed on the TMA sample stage, cooled to <−50° C., then heated to 200° C. at 5° C./min under a He atmosphere. Dimensional change was measured by vertical displacement of the macro expansion probe placed on a sample with a 1 g load. Only in-plane CTE values were measured. The coefficient of thermal expansion of the composite mold assembly 430 was found to range from about 50 to about 180 ppm per degree Celsius.

The mold assembly 430 may then be used to apply, transfer, or otherwise form a pattern corresponding to the master pattern 425 on a substrate 435, as shown in FIG. 4C. In one embodiment, the pattern is transferred to a UV curable arcylate film 440 that has been spin-coated on a silicon wafer 435. The mold assembly 440 is placed on top of the arcylate film 435. The UV light is shined through the mold assembly 430 and the arcylate coating 440 under it was cured. After the UV cure, the mold assembly 430 was lifted from the film 440 so that the patterns on the mold assembly 430 are transferred to the cured acrylate mold 440. However, persons of ordinary skill in the art having benefit of the present disclosure should appreciate that the techniques used to apply, transfer, or form patterns in or on the substrate 435 or film 440 are matters of design choice and not material to the present invention.

Figure 5A:
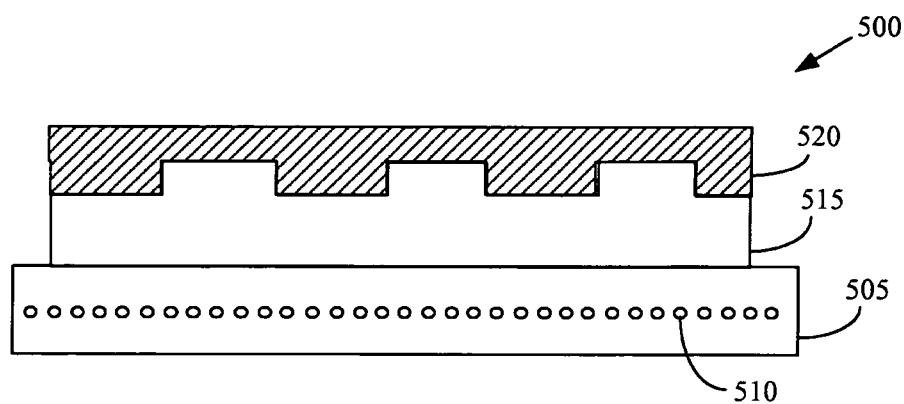
FIGS. 5A, 5B, and 5C conceptually illustrate a fifth exemplary embodiment of a method of forming a soft lithographic mold, in accordance with the present invention.
Figure 5B:
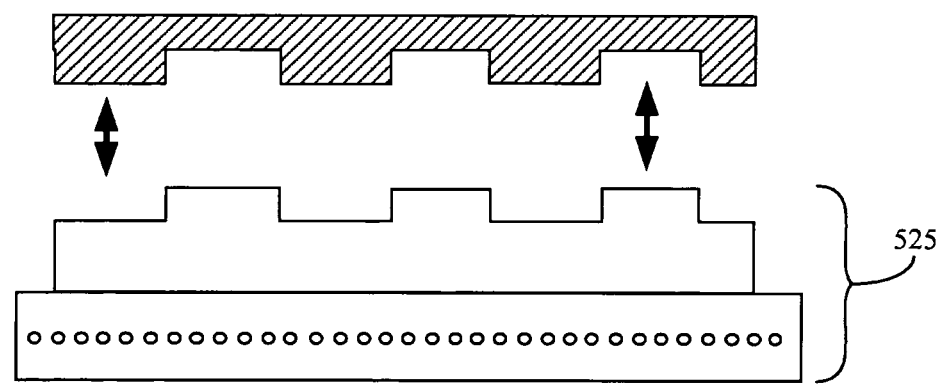
Figure 5C:
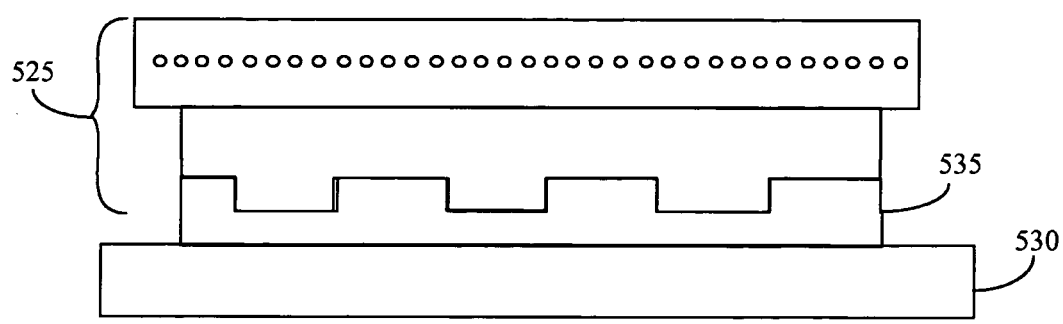

FIGS. 5A, 5B, and 5C conceptually illustrate a fifth exemplary embodiment of a method 500 of forming a soft lithographic mold. In the illustrated embodiment, a pre-cured silicone resin film 505 reinforced with fibrous material 510 is provided as the substrate. The fiber-reinforced silicone resin film 505 may be formed according to one or more of the techniques described above. For example, a first film of curable silicon-containing composition may be applied to a second film and fibrous material 510 that has been impregnated with the second film. The two films may be applied using the conventional techniques described above. The films and the fibrous material 510 may then be cured using any of the techniques described above to form the fiber-reinforced silicon resin film 505.

A patterned mold 515 may then be formed adjacent the fiber-reinforced silicon resin film 505. In the illustrated embodiment, the patterned mold 515 is formed by depositing a curable silicon-containing composition, which may or may not be the same as the composition used to form the fiber-reinforced silicon resin film 505, adjacent the fiber-reinforced silicon resin film 505 and allowing the composition to at least partially cure. For example, Sylgard 184 and an appropriate crosslinker, which may be supplied by Dow Corning Corporation as a kit, may be mixed to form the curable silicon-containing composition.

In one embodiment, a square metal frame (not shown) may be placed on the fiber-reinforced silicon resin film 505. In one embodiment, the thickness of the frame is 2.0 mm. However, the thickness of the frame is a matter of design choice and not material to the present invention, although the thickness may be determined by the desired thickness of the elastomeric layer of the mold 515. In one embodiment, the inner opening of the frame is a square measuring at 6"×6". However, the size of the opening of the frame is a matter of design choice and not material to the present invention, although the size of the opening may be determined by the desired size and shape of the patterning area in the subsequent printing or other patterning steps. The catalyzed Sylgard 184 may be poured into the opening of the frame and left at room temperature for half an hour to self degas.

A master 520 may then be brought into contact with the curable silicon-containing composition that will be used to form the mold 515. For example, a silicon wafer with engraved patterns on one side may be placed in contact with the curable silicon-containing composition such that the engraved pattern faces into the curable silicon-containing composition. In one embodiment, slight pressure may be applied on the back of the master 520, although one or more edges of the master 520 may be sitting on the metal frame described above. The whole assembly may be cured, e.g. in an air circulating oven at 150° C. for 10 minutes.

The cured mold assembly 525, which may include the mold 515 and the fiber-reinforced silicon resin film 505, may be separated from the master 520. If a metal frame was present, then the metal frame may also be removed from the mold assembly 525. Since the fiber-reinforced silicon resin film 505 acts as the substrate, the fifth exemplary embodiment may have the additional advantage that it is not necessary to separate the cured mold assembly 525 from a substrate. Persons of ordinary skill in the art having benefit of the present disclosure should appreciate that the particular sequence of events used to separate the mold assembly 525 from the master pattern 520 and, if present, the metal frame or any other structures, is not material to the present invention and any sequence or technique for separating the mold assembly 525 may be used.

The coefficient of thermal expansion of the mold assembly 525 may be reduced by the presence of the fiber-reinforced silicon resin film 505. For example, the coefficient of linear thermal expansion (CTE) of the composite silicon elastomer mold assembly 525 described above may be measured via a thermal mechanical analysis (TMA) method. For example, samples of the mold assembly 525 were examined for linear coefficient of thermal expansion using a TA Instruments 2940 TMA with macro expansion probe. Samples were cut and placed on the TMA sample stage, cooled to <−50° C., then heated to 200° C. at 5° C./min under a He atmosphere. Dimensional change was measured by vertical displacement of the macro expansion probe placed on a sample with a 1 g load. Only in-plane CTE values were measured. The coefficient of thermal expansion of the composite mold assembly 525 was found to range from about 5 to about 55 ppm per degree Celsius.

The mold assembly 525 may then be used to apply, transfer, or otherwise form a pattern corresponding to the master pattern 520 on a substrate 530, as shown in FIG. 5C. In one embodiment, the pattern is transferred to a UV curable arcylate film 535 that has been spin-coated on a silicon wafer 530. The mold assembly 525 is placed on top of the arcylate film 535. The UV light is shined through the mold assembly 525 and the arcylate coating 535 under it was cured. After the UV cure, the mold assembly 525 was lifted from the film 535 so that the patterns on the mold assembly 525 are transferred to the cured acrylate mold 535. However, persons of ordinary skill in the art having benefit of the present disclosure should appreciate that the techniques used to apply, transfer, or form patterns in or on the substrate 530 or film 535 are matters of design choice and not material to the present invention.

Embodiments of the techniques described above for forming soft lithographic molds may have a number of advantages over conventional practice. For example, glass fabric reinforced silicone resin films show a coefficient of thermal expansion of only 5 to 10 ppm/° C. above room temperature. Polydimethylsiloxane PDMS adheres strongly to the reinforced resin films described above and the coefficient of thermal expansion of the composite structures that include the reinforced resin films described above may be dominated by the reinforced silicone resin film while the ability of the PDMS to replicate and print fine features is not affected. Furthermore, the shape of the UV transmission spectrum of the composite mold including a reinforced methyl T resin based film is similar to that of the PDMS mold, although the absolute transmission may be reduced slightly by scattering by the fiber. Thus, the techniques described above may form soft lithographic molds that are flexible and have very low coefficients of thermal expansion and exhibit very good adhesion. The composite molds-masks are also anticipated to be much more UV stable than PMMA based molds. Furthermore, the choice of backing layer can be extended to un-reinforced silicone resin films, as well as other inorganic and organic polymer films.

The particular, embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a soft lithographic mold including at least one feature having a characteristic length in a range from 0.1 μm to 1 μm by forming a pattern representative of said at least one feature on a first side of an elastomer, the second side of the elastomer being impregnated with a fibrous material; the pattern consisting essentially of a curable elastomeric silicone composition formed using a de-volatilized polymer and at least one de-volatilized cross-linker, and optionally at least one inhibitor and at least one catalyst; the fibrous material being degassed by subjecting it to vacuum at a temperature that is between about 23° C. to 60° C. for a period of time sufficient to remove entrapped air embedded therein.

2. The method of claim 1, wherein the de-volatilized polymer comprises a polymer exposed to at least one of a vacuum and heat to remove volatiles from the polymer, and wherein the de-volatilized polymer comprises a de-volatilized vinyl functional siloxane polymer.

3. The method of claim 1, wherein the de-volatilized cross-linker comprises a cross-linker exposed to at least one of a vacuum and heat to remove volatiles from the cross-linker, and, wherein said at least one de-volatilized cross-linker comprises a de-volatilized methyl hydrogen siloxane polymer with SiH functional groups.

4. The method of claim 1, wherein the catalyst has a concentration of 0.1 to 1000 ppm and the inhibitor has a concentration of about 0 to 10wt. %.

5. The method of claim 1, wherein impregnating the elastomer comprises depositing the curable silicon-containing composition in or on a glass fabric comprising a plurality of glass fibers in a plurality of openings there between.

6. The method of claim 1, wherein impregnating the elastomer comprises forming a fiber-reinforced film that is at least partially cured, a portion of the elastomer being adjacent the fiber-reinforced film.

7. The method of claim 6, wherein forming the fiber-reinforced film comprises:
forming a first layer of the curable elastomeric silicone composition formed using the devolatilized polymer and at least one de-volatilized cross-linker;
positioning the fibrous material such that a first side of the fibrous material is adjacent to the first layer;
forming a second layer of the silicon-containing composition adjacent a second side of the fibrous material, the second side being opposite the first side; and
curing, at least partially, the first and second layers.

8. The method of claim 7, wherein positioning the fibrous material comprises positioning a glass fabric comprising a plurality of glass fibers and a plurality of openings there between.

9. The method of claim 8, wherein forming the pattern in the elastomer comprises depositing the curable silicon-containing composition adjacent a portion of the fiber-reinforced film, wherein the curable silicon-containing composition comprises a silicone resin and a cross-linker adjacent the portion of the fiber-reinforced film.

10. A method of forming a soft lithographic mold including at least one feature having a characteristic length in a range from 0.1 μm to 1 μm comprising:
forming a pattern representative of said at least one feature on a first side of an elastomer; the elastomer being a curable silicon-containing composition consisting essentially of a de-volatilized polymer and at least one de-volatilized cross-linker; and
forming a rigid silicone resin film that includes a fibrous material, a portion of the second side of the elastomer being adjacent the rigid silicone resin film; the fibrous material being degassed by subjecting it to vacuum at a temperature that is between about 23° C. to 60° C. for a period of time sufficient to remove entrapped air embedded therein.

11. The method of claim 10, wherein forming the rigid silicone resin film comprises depositing a curable silicone resin composition over a substrate, and curing the curable composition.

12. The method of claim 10, wherein forming the pattern in the elastomer comprises depositing a curable silicon-containing composition adjacent a portion of the rigid silicone resin film.

13. The method of claim 12, wherein depositing the curable silicon-containing composition comprises depositing a composition wherein the de-volatilized polymer is a silicone resin.

14. The method of claim 1, wherein forming the pattern in the elastomer comprises:
contacting a portion of the curable silicon-containing composition with a master pattern;

curing, at least partially, the silicon-containing composition;

removing the master pattern from contact with the at least partially cured silicon-containing composition;

curing the at least partially cured silicon-containing composition to form the elastomer; and forming a pattern on a substrate using the pattern formed in the elastomer.

* * * * *